US010861581B2

(12) United States Patent
Park

(10) Patent No.: US 10,861,581 B2
(45) Date of Patent: Dec. 8, 2020

(54) MEMORY SYSTEM FOR ACCESSING RECOVERED SUPER BLOCK AND OPERATING METHOD THEREOF

(71) Applicant: SK hynix Inc., Gyeonggi-do (KR)

(72) Inventor: Soo-Jin Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 244 days.

(21) Appl. No.: 15/995,783

(22) Filed: Jun. 1, 2018

(65) Prior Publication Data

US 2018/0366210 A1 Dec. 20, 2018

(30) Foreign Application Priority Data

Jun. 19, 2017 (KR) .................. 10-2017-0077233

(51) Int. Cl.
*G06F 11/10* (2006.01)
*G11C 29/00* (2006.01)
*G11C 7/10* (2006.01)
*G06F 12/02* (2006.01)
*G06F 12/06* (2006.01)

(52) U.S. Cl.
CPC ........ *G11C 29/886* (2013.01); *G06F 11/1048* (2013.01); *G11C 7/1042* (2013.01); *G11C 29/82* (2013.01); *G06F 12/0246* (2013.01); *G06F 12/0607* (2013.01); *G06F 2212/1032* (2013.01); *G06F 2212/1044* (2013.01); *G06F 2212/7205* (2013.01); *G06F 2212/7208* (2013.01)

(58) Field of Classification Search
CPC ..... G11C 29/886; G11C 29/82; G11C 7/1042; G06F 11/1048; G06F 12/0246; G06F 12/0607; G06F 2212/1032; G06F 2212/1044; G06F 2212/7205; G06F 2212/7208
See application file for complete search history.

(56) References Cited

U.S. PATENT DOCUMENTS 8,832,507 B2 * 9/2014 Post ...................... G11C 29/82
714/718
10,528,469 B2 * 1/2020 Koo ........................ G06F 13/16
(Continued)

FOREIGN PATENT DOCUMENTS

KR 1020090056966 6/2009
KR 1020110127729 11/2011
KR 1020120098068 9/2012

*Primary Examiner* — Kamini B Patel
(74) *Attorney, Agent, or Firm* — IP & T Group LLP

(57) ABSTRACT

A memory system includes a memory device including a plurality of blocks, and a controller suitable for managing the plurality of blocks by grouping the plurality of blocks into a plurality of super blocks in accordance with a predetermined condition, managing normal blocks which are not grouped into the super blocks in a replacement block pool, setting each of the plurality of super blocks that includes at least one bad block to a bad super block, and then changing each bad super block in which the at least one bad block is replaced with a normal block of the replacement block pool using replacement information to a recovery super block, wherein the replacement information includes in a bitmap indicative of whether or not an interleaving operation of each of the recovery super blocks is possible.

14 Claims, 12 Drawing Sheets

(56) References Cited

U.S. PATENT DOCUMENTS

| | | | |
|---|---|---|---|
| 2009/0059695 A1* | 3/2009 | Kim | G11C 29/808 |
| | | | 365/200 |
| 2009/0282301 A1* | 11/2009 | Flynn | G11C 29/76 |
| | | | 714/710 |
| 2010/0228940 A1* | 9/2010 | Asnaashari | G06F 12/0246 |
| | | | 711/170 |
| 2012/0079168 A1* | 3/2012 | Chou | G06F 12/0246 |
| | | | 711/103 |
| 2015/0052393 A1* | 2/2015 | Palmer | G06F 11/108 |
| | | | 714/15 |
| 2018/0068731 A1* | 3/2018 | Kim | G06F 3/0604 |
| 2018/0151251 A1* | 5/2018 | Oh | G11C 29/76 |
| 2018/0366210 A1* | 12/2018 | Park | G06F 11/1048 |
| 2020/0073573 A1* | 3/2020 | Park | G11C 29/886 |

* cited by examiner

FIG. 7A

| | | DIE 0 | | | DIE 1 | | | DIE 3 | | | DIE 4 | |
|---|---|---|---|---|---|---|---|---|---|---|---|---|
| | | PLANE0 | PLANE1 | | PLANE0 | PLANE1 | | PLANE0 | PLANE1 | | PLANE0 | PLANE1 |
| SUPER BLOCK 718 | | BLOCK 718_0 | BLOCK 718_1 | ... | BLOCK 718_9 | BLOCK 718_10 | ... | BLOCK 718_17 | BLOCK 718_18 | ... | BLOCK 718_25 | BLOCK 718_26 |
| SUPER BLOCK 820 | | BLOCK 820_0 | BLOCK 820_1 | ... | BLOCK 820_9 | BLOCK 820_10 | ... | BLOCK 820_17 | BLOCK 820_18 | ... | BLOCK 820_25 | BLOCK 820_26 |
| SUPER BLOCK 1021 | | BLOCK 1021_0 | BLOCK 1021_1 | ... | BLOCK 1021_9 | BLOCK 1021_10 | ... | BLOCK 1021_17 | BLOCK 1021_18 | ... | BLOCK 1021_25 | BLOCK 1021_26 |
| REPLACEMENT BLOCK POOL | | BLOCK D1 | BLOCK D2 | ... | BLOCK D9 | BLOCK D10 | ... | BLOCK D17 | BLOCK D18 | ... | BLOCK D25 | BLOCK D26 |
| | | BLOCK D33 | BLOCK D34 | ... | BLOCK D41 | BLOCK D42 | ... | BLOCK D49 | BLOCK D50 | ... | BLOCK D57 | BLOCK D58 |

▨ BAD MEMORY BLOCK

700

MEMORY SYSTEM FOR ACCESSING RECOVERED SUPER BLOCK AND OPERATING METHOD THEREOF

CROSS-REFERENCE TO RELATED APPLICATION(S)

The present application claims priority under 35 U.S.C. § 119(a) to Korean Patent Application No. 10-2017-0077233, filed on Jun. 19, 2017, the disclosure of which is incorporated herein by reference in its entirety.

BACKGROUND

1. Field

Various embodiments of the present invention generally relate to a memory system. Particularly, the embodiments relate to a memory system for processing data with a memory device, and an operating method thereof.

2. Description of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various embodiments of the present invention are directed to a memory system capable of managing a plurality of memory blocks included in a memory device in units of super memory blocks, and an operating method of the memory system.

In accordance with an embodiment of the present invention, a memory system includes: a memory device including a plurality of blocks; and a controller suitable for managing the plurality of blocks by grouping the plurality of blocks into a plurality of super blocks in accordance with a predetermined condition, managing normal blocks which are not grouped into the super blocks in a replacement block pool, setting each of the plurality of super blocks that includes at least one bad block to a bad super block, and then changing each bad super block in which the at least one bad block is replaced with a normal block of the replacement block pool using replacement information to a recovery super block, wherein the replacement information includes in a bitmap indicative of whether or not an interleaving operation of each of the recovery super blocks is possible.

The controller may include flag information having a first value in the replacement information for replacing the bad blocks of the respective bad super blocks with a normal block of the replacement block pool in accordance with a first priority of the predetermined condition in which the interleaving operation is possible, and include flag information having a second value in the replacement information for replacing the at least one bad blocks of the respective bad super blocks with a normal block of the replacement block pool in a form corresponding to a second priority of the predetermined condition in which the interleaving operation is impossible.

When accessing a specific recovery super block in which at least one normal block of the replacement block pool replaces at least one bad block, the controller may operate the specific recovery super block in an interleaving scheme when it is determined that the flag information having the first value is included in the replacement information, and may not operate the specific recovery super block in the interleaving scheme when it is determined that the flag information having the second value is included in the replacement information.

The controller may manage the blocks as the super blocks by grouping the blocks according to the first priority of the predetermined condition in which the interleaving operation is possible.

The memory device may further include a plurality of planes, respectively corresponding to a plurality of ways that share a single channel, among a plurality of channels, for inputting or outputting data in the interleaving scheme, each of the plurality of planes including a set of blocks of the plurality of blocks, and the memory device may further include a plurality of memory dies, each corresponding to a respective one of the plurality of channels, each of the plurality of dies including a set of planes of the plurality of the planes.

The controller may include a relationship between a block in a first plane of a first memory die and a block in a second plane of the first memory die, a relationship between a block included in a first plane of a second memory die and a block in a second plane of the second memory die, a relationship between a block in the first plane of the first memory die and a block in the first plane of the second memory die, a relationship between a block in the second plane of the first memory die and a block in the second plane of the second memory dies, and a relationship between a block in the first plane of the first memory die, a block in the second plane of the first memory die, a block in the first plane of the second memory die and a block in the second plane of the second memory dies in the first priority of the predetermined condition.

The controller may include a relationship between two or more blocks included in any one of the planes in the second priority of the predetermined condition.

A physical table for indicating a physical address of each of the normal blocks of the replacement block pool may be included in index form in the replacement information, and the controller may store physical addresses of the bad blocks of each of the bad super blocks and the flag information corresponding to the physical addresses in the physical table corresponding to the normal blocks of the replacement block pool, which are used for replacing the bad blocks of the bad super blocks.

The controller may replace the physical addresses of the bad blocks among physical addresses of blocks in each of the bad super blocks with the physical addresses of the normal blocks of the replacement block pool, which are used for replacing the bad blocks, referring to the physical table, and then may manage the physical addresses corresponding to each of the recovery super blocks.

The controller may generate bad occurrence information for managing the super blocks in the bitmap by dividing the super blocks into normal super blocks and bad super blocks.

In accordance with an embodiment of the present invention, an operating method of a memory system that includes a memory device including a plurality of blocks includes: managing the plurality of blocks by grouping the plurality of blocks into a plurality of super blocks in accordance with a predetermined condition; managing normal blocks which are not grouped into the super blocks in a replacement block pool; and setting each of the plurality of super blocks that includes at least one bad block to a bad super block, and then changing each bad super block in which at least one bad block is replaced with a normal block of the replacement block pool using replacement information to a recovery super block, wherein the replacement information includes a bitmap indicative of whether or not an interleaving operation of each of the recovery super blocks is possible.

The setting and changing operation may include: setting each super block that includes at least one bad block to a bad super block; including flag information having a first value in the replacement information for replacing the at least one bad block of the respective bad super blocks with at least one normal block of the replacement block pool in a form corresponding to a first priority of the predetermined condition in which the interleaving operation is possible; and including flag information having a second value in the replacement information for replacing the at least one bad block of the respective bad super blocks with at least one normal block of the replacement block pool in a form corresponding to a second priority of the predetermined condition in which the interleaving operation is impossible.

The operating method may further include: when accessing a specific recovery super block in which at least one normal block of the replacement block pool are places at least one bad block, checking a value of the flag information included in the replacement information; operating the specific recovery super block in an interleaving scheme when it is determined that the flag information having the first value is included in the replacement information; and not operating the specific recovery super block in the interleaving scheme when it is determined that the flag information having the second value is included in the replacement information.

The managing of the plurality of blocks may be carried out by grouping the blocks according to the first priority of the predetermined condition in which the interleaving operation is possible.

The memory device may include: a plurality of planes, respectively corresponding to a plurality of ways that share a single channel, among a plurality of channels, for inputting or outputting data in the interleaving scheme, each of the plurality of planes including a set of blocks of the plurality of blocks; and a plurality of memory dies, each corresponding to a respective one of the plurality of channels, each of the plurality of dies including a set of planes of the plurality of planes.

The first priority of the predetermined condition may include a relationship between a block included in a first plane of a first memory die and a block in a second plane of the first memory die, a relationship between a block in a first plane of a second memory die and a block in a second plane of the second memory die, a relationship between a block in the first plane of the first memory die and a block in the first plane of the second memory die, a relationship between a block in the second plane of the first memory die and a block in the second plane of the second memory dies, and a relationship between a block in the first plane of the first memory die, a block in the second plane of the first memory die, a block in the first plane of the second memory die and a block in the second plane of the second memory dies.

The second priority of the predetermined condition may include a relationship between two or more blocks included in any one of the planes.

A physical table for indicating a physical address of each of the normal blocks of the replacement block pool may be included in index form in the replacement information, and the setting and changing operation may further include: storing physical addresses of the bad blocks of each of the bad super blocks and the flag information corresponding to the physical addresses in the physical table corresponding to the normal blocks of the replacement block pool, which are used for replacing the bad blocks of the bad super blocks.

The setting and changing operation may further include: replacing the physical addresses of the bad blocks among physical addresses of blocks in each of the bad super blocks with the physical addresses of the normal blocks of the replacement block pool, which are used for replacing the bad blocks, referring to the physical table, and then managing the physical addresses corresponding to each of the recovery super blocks.

The setting and changing operation may include: generating bad occurrence information for managing the super blocks in the bitmap form by dividing the super blocks into normal super blocks and bad super blocks.

In accordance with an embodiment of the present invention, a memory system includes: a memory device including a plurality of super blocks each having a group of memory blocks, and a plurality of reserved blocks; and a controller suitable for accessing a recovery super block, which is generated for a bad super block by replacing a bad memory block in the bad super block with a reserved block, by referring to a bitmap and replacement information, wherein the bitmap represents whether a super block is determined as the bad super block, wherein the replacement information represents a bad memory block in the bad super block and a flag corresponding to the reserved block, and wherein the controller controls the memory device to perform the interleaving operation on the recovery super block according to the flag when accessing the recovery super block.

BRIEF DESCRIPTION OF THE DRAWINGS

FIGS. 7A and 7B are diagrams illustrating a method of recovering a super memory block including bad memory blocks in a memory system in accordance with an embodiment of the present invention.

DETAILED DESCRIPTION

Figure 1:
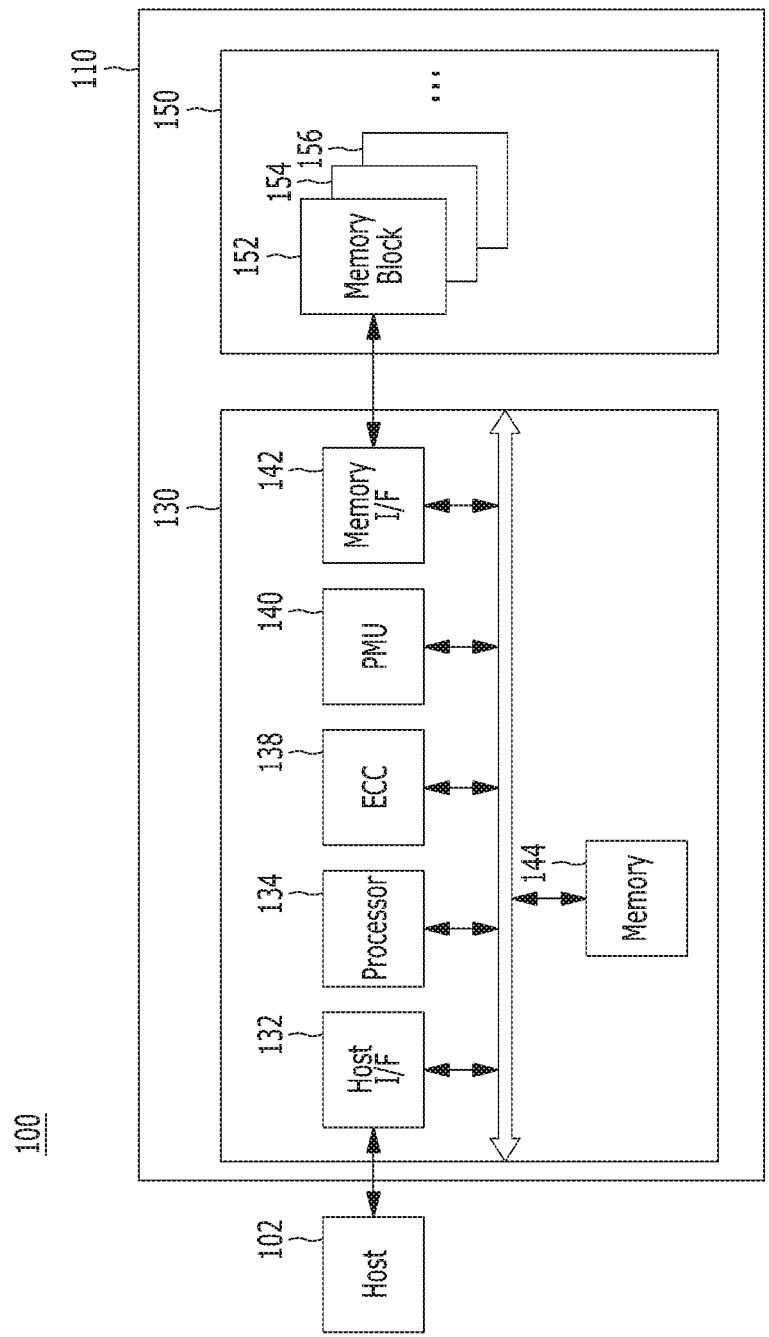
FIG. 1 is a block diagram illustrating a data processing system including a memory system in accordance with an embodiment of the present invention.

Various embodiments of the present invention are described below in more detail with reference to the accompanying drawings. It is noted, however, that the present invention may be embodied in different forms. Moreover, aspects and features of the present invention may be configured or arranged differently than shown in the illustrated embodiments. Thus, the present invention is not to be construed as being limited to the embodiments set forth herein. Rather, the described embodiments are provided so that this disclosure is thorough and complete and will fully conveys the present invention to those skilled in the art to which this invention pertains. Throughout the disclosure, like reference numerals refer to like parts throughout the various figures and embodiments of the present invention.

It will be understood that, although terms such as "first", "second", "third" may be used herein to identify various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or connected or coupled to the latter via one or more intervening elements in between.

It will be further understood that reference to "an embodiment" is not necessarily to only one embodiment, and different references to "an embodiment" are not necessarily to the same embodiment(s).

The terminology used herein is for the purpose of describing particular embodiments and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements but do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include any of a variety of portable electronic devices such as a mobile phone, MP3 player and laptop computer or any of a variety of non-portable electronic devices such as a desktop computer, game machine, TV and projector.

The host 102 may include at least one operating system (OS), which may manage and control overall functions and operations of the host 102, and provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110. The host 102 may provide a plurality of commands corresponding to a user's request(s) to the memory system 110, and thus the memory system 110 may perform certain operations corresponding to the plurality of commands, that is, corresponding to the user's request(s).

The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, a compact flash (CF) card, a smart media card (SMC), a personal computer memory card international association (PCMCIA) card, and a memory stick. The MMC may be configured as an embedded MMC (eMMC), reduced size MMC (RS-MMC) and/or micro-MMC. The SD card may be a mini-SD card and/or micro-SD card.

The memory system 110 may include any of various types of storage devices. Non-limited examples of such storage devices may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in any of the various types of memory systems as exemplified above. For example, the controller 130 and the memory device 150 may be integrated as a single semiconductor device to constitute an SSD. When the memory system 110 is used as an SSD, the operating speed of the host 102 connected to the memory system 110 can be improved. In another example, the controller 130 and the memory device 150 may be integrated as a single semiconductor device to constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain stored data even though power is not supplied. The memory device 150 may store data provided from the host 102 through a write operation, and provide stored data to the host 102 through a read operation. In an embodiment, the memory device 150 may include a plurality of memory dies (not shown), each of which may include a plurality of planes (not shown). Each plane may include a plurality of memory blocks 152, 154, 156 . . . (hereinafter, referred to as 'memory blocks 152 to 156'), each of which may include a plurality of pages, and each of the pages may include a plurality of memory cells coupled to a word line. In an embodiment, the memory device 150 may be a flash memory having a 3-dimensional (3D) stack structure, which will be described in more detail with reference to FIG. 4 below.

The structure of the memory device 150 including the 3D stack structure of the memory device 150 will be described in detail later with reference to FIGS. 2 to 4. The memory device 150 including memory dies, planes, and memory blocks 152 to 156 will be described in detail later with reference to FIG. 6. Accordingly, further description of these elements is omitted immediately below.

The controller 130 may control the memory device 150 in response to a request from the host 102. Specifically, the controller may control a read operation, a write operation (also referred to as a program operation), and an erase operation of the memory device 150. For example, the controller 130 may provide data read from the memory device 150 to the host 102, and store data provided from the host 102 into the memory device 150.

The controller 130 may include a host interface (I/F) 132, a processor 134, an error correction code (ECC) unit 138, a Power Management Unit (PMU) 140, a memory interface 142 such as a NAND flash controller, and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via firmware, that is, a host interface layer (HIL) for exchanging data with the host 102.

The ECC unit 138 may correct error bits of data to be processed by the memory device 150 and may include an ECC encoder and an ECC decoder. The ECC encoder may perform error correction encoding on data to be programmed into the memory device 150 to generate data to which a parity bit is added. The data including the parity bit may be stored in the memory device 150. The ECC decoder may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to these error correction techniques. Accordingly, the ECC component 138 may include all circuits, modules, systems or devices for error correction.

The PMU 140 may provide and manage power of the controller 130.

The memory interface 142 may serve as a memory/storage interface for interfacing the controller 130 and the memory device 150 such that the controller 130 may control the memory device 150 in response to a request from the host 102. When the memory device 150 is a flash memory or specifically a NAND flash memory, the memory interface 142 may be NAND flash controller (NFC) and may generate a control signal for the memory device 150 and process data to be provided to the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150. The memory interface 142 may be driven via firmware, that is, a flash interface layer (FIL) for exchanging data with the memory device 150.

The memory 144 may serve as a working memory of the memory system 110 and the controller 130, and store data for driving the memory system 110 and the controller 130. The controller 130 may control the memory device 150 to perform read, write, program, and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by a static random access memory (SRAM) or a dynamic random access memory (DRAM). The memory 144 may be disposed within or externally to the controller 130. FIG. 1 shows, by way of example, the memory 144 disposed within the controller 130. In an embodiment, the memory 144 may be embodied by an external volatile memory having a memory interface transferring data between the memory 144 and the controller 130.

As described above, the memory 144 may include a program memory, a data memory, a write buffer/cache, a read buffer/cache, a data buffer/cache and a map buffer/cache to store data required to perform data write and read operations between the host 102 and the memory device 150 and data required for the controller 130 and the memory device 150 to perform these operations.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a Central Processing Unit (CPU).

For example, the controller 130 may perform an operation requested by the host 102 in the memory device 150 through the processor 134, which is implemented as a microprocessor, a CPU, or the like. In other words, the controller 130 may perform a command operation corresponding to a command received from the host 102. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command, or a set feature command as a set command.

Also, the controller 130 may perform a background operation on the memory device 150 through the processor 134, which is implemented as a microprocessor or a CPU. The background operation performed on the memory device 150 may include an operation of copying and processing data stored in some memory blocks among the memory blocks 152 to 156 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

The processor 134 of the controller 130 may include a management unit (not illustrated) for performing a bad management operation of the memory device 150. The management unit may perform a bad block management operation of checking a bad block, in which a program fail occurs due to a characteristic of the memory device, for example, a NAND flash memory during a program operation. The management unit may write the program-failed data of the bad block to a new memory block. In the memory device 150 having a 3D stack structure, the bad block management operation may reduce the use efficiency of the memory device 150 and the reliability of the memory system 110. Thus, a more reliably performed bad block management operation is desirable.

Figure 2:
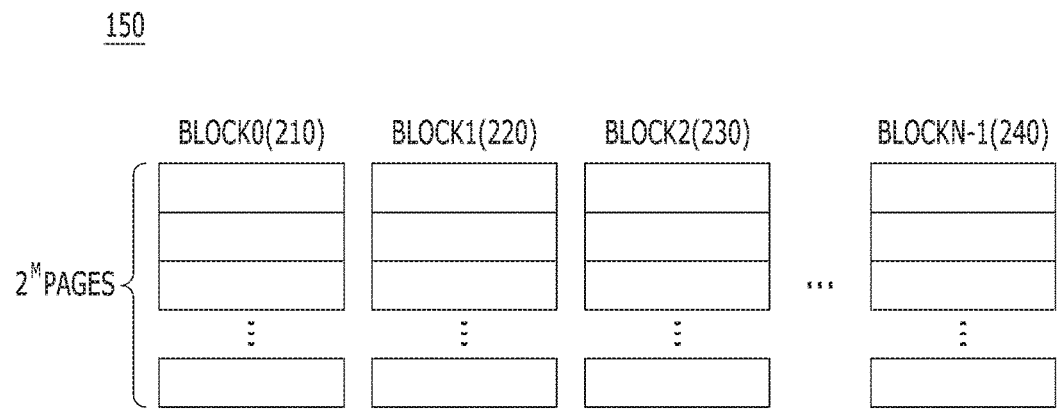
FIG. 2 is a schematic diagram illustrating an exemplary configuration of a memory device employed in the memory system of FIG. 1.

FIG. 2 is a schematic diagram illustrating an exemplary configuration of the memory device 150 employed in the memory system 110 of FIG. 1.

Referring to FIG. 2, the memory device 150 may include a plurality of memory blocks BLOCK0 to BLOCKN−1, each of which may include a plurality of pages, for example, $2^M$ pages, the number of which may vary depending on circuit design.

Also, memory cells included in the respective memory blocks BLOCK0 to BLOCKN−1 may be one or more of a single level cell (SLC) memory block storing 1-bit data or a multi-level cell (MLC) memory block storing 2-bit data. Hence, the memory device 150 may include SLC memory blocks or MLC memory blocks, depending on the number of bits which can be expressed or stored in each of the memory cells in the memory blocks. The SLC memory blocks may include a plurality of pages that are embodied by memory cells each storing one-bit data and may generally have high data computing performance and high durability. The MLC memory blocks may include a plurality of pages which are embodied by memory cells each storing multi-bit data (for example, 2 or more bits), and may generally have a larger data storage space than the SLC memory block, that is, higher integration density. In another embodiment, the memory device 150 may include a plurality of triple level cell (TLC) memory blocks. In yet another embodiment, the memory device 150 may include a plurality of quadruple level cell (QLC) memory blocks. The TCL memory blocks may include a plurality of pages which are embodied by memory cells each capable of storing 3-bit data. The QLC memory blocks may include a plurality of pages which are embodied by memory cells each capable of storing 4-bit data. Although embodiments of the present invention describe, by way of example, that the memory device 150 may be the nonvolatile memory, it may implemented by any one of a phase change random access memory (PCRAM), a resistive random access memory (RRAM(ReRAM)), a ferroelectrics random access memory (FRAM), and a spin transfer torque magnetic random access memory (STT-RAM(STT-M RAM)).

Figure 3:
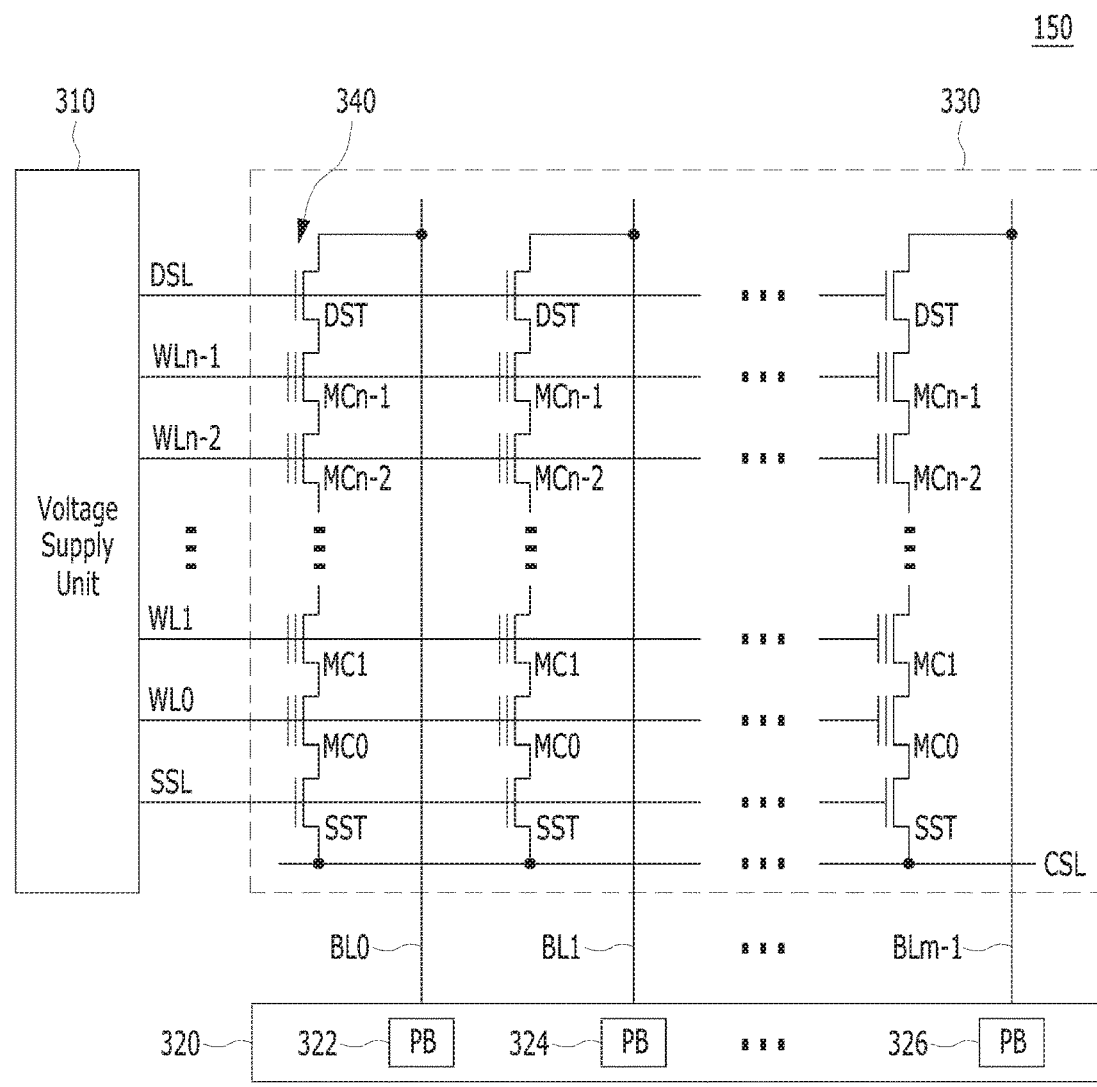
FIG. 3 is a circuit diagram illustrating an exemplary configuration of a memory cell array of a memory block in the memory device shown in FIG. 1.

FIG. 3 is a circuit diagram illustrating an exemplary configuration of a memory cell array of a memory block 330 in the memory device 150. For example, the memory block 330 may correspond to any of the plurality of memory blocks 152 to 156 in the memory device 150 of the memory system 110.

Referring to FIG. 3, the memory block 330 may include a plurality of cell strings 340 coupled to a plurality of corresponding bit lines BL0 to BLm−1. For reference, in FIG. 3, 'DSL' denotes a drain select line, 'SSL' denotes a source select line, and 'CSL' denotes a common source line. Each of the cell strings 340 may be electrically coupled to a bit line BL, at least one source select line SSL, a plurality of word lines WL, at least one dummy word line DWL, and a common source line CSL. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the present disclosure is not limited thereto. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage, and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
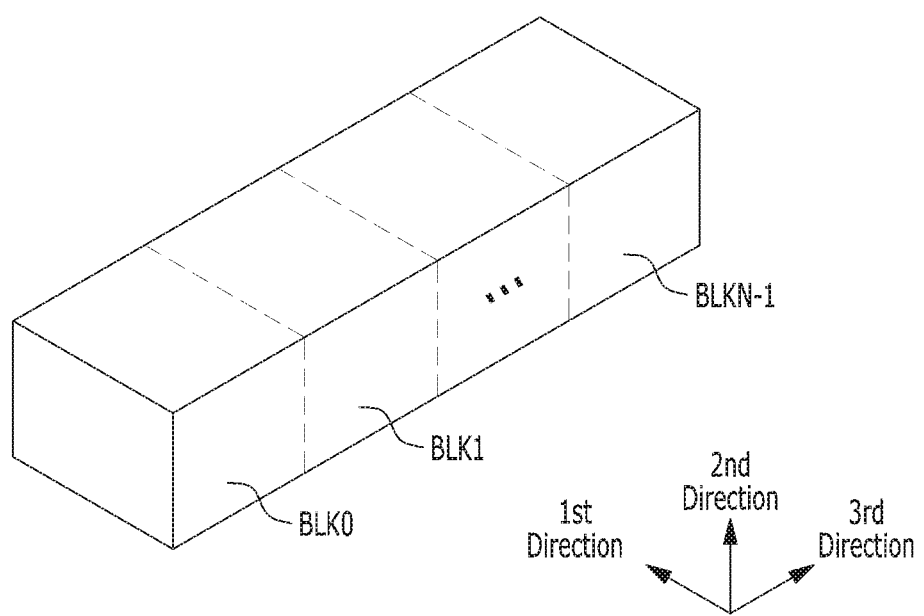
FIG. 4 is a block diagram illustrating an exemplary three-dimensional structure of the memory device shown in FIG. 2.

FIG. 4 is a schematic diagram illustrating an exemplary 3D structure of the memory device 150.

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1, each having a 3D structure (or vertical structure).

A data processing operation for a memory device, particularly, a data processing operation performed when a plurality of command operations corresponding to a plurality of commands received from the host 102 are performed, in a memory system in accordance with an embodiment of the present invention, will be described in detail with reference to FIGS. 5 to 7B.

Figure 5:
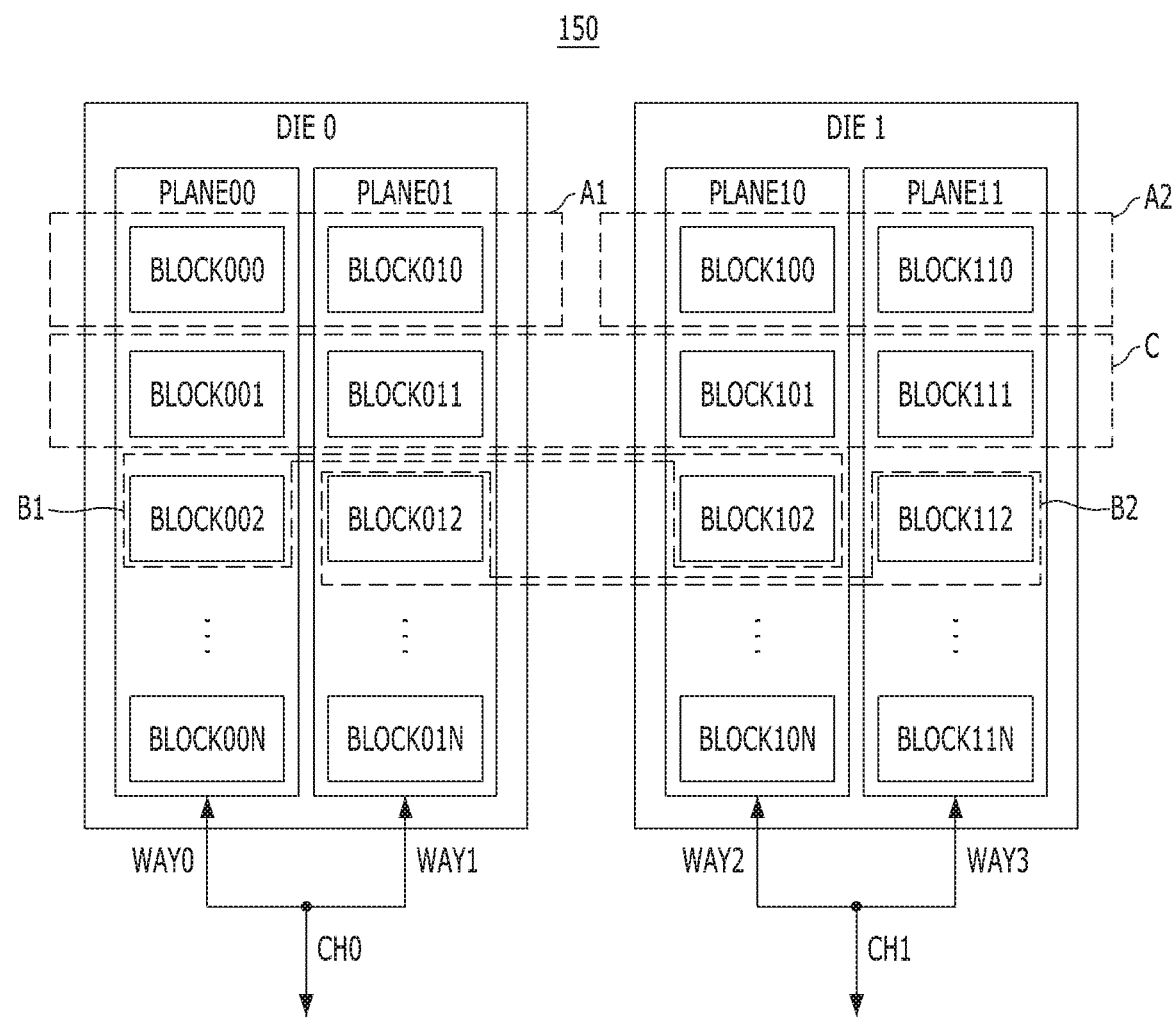
FIG. 5 is a diagram illustrating an aspect of the invention pertaining to a super memory block used in a memory system in accordance with an embodiment of the present invention.

FIG. 5 is a diagram illustrating an inventive concept of a super memory block used in a memory system in accordance with an embodiment of the present invention.

FIG. 5 illustrates in detail constituent elements of the memory device 150 shown in FIG. 1 in accordance with an embodiment of the present invention.

The memory device 150 may include a plurality of memory blocks BLOCK000 to BLOCK00N, BLOCK010 to BLOCK01N, BLOCK100 to BLOCK10N, and BLOCK110 to BLOCK11N.

In addition, the memory device 150 may include a first memory die DIE0 capable of inputting/outputting data through a zeroth channel CH0 and a second memory die DIE1 capable of inputting/outputting data through a first channel CH1. The zeroth and first channels CH0 and CH1 may input/output data in an interleaving scheme.

The first memory die DIE0 may include a plurality of planes PLANE00 and PLANE01 respectively corresponding to a plurality of ways WAY0 and WAY1. The ways WAY0 and WAY1 may input/output data in the interleaving scheme by sharing the zeroth channel CH0.

The second memory die DIE1 may include a plurality of planes PLANE 10 and PLANE 11 respectively corresponding to a plurality of ways WAY2 and WAY3. The ways WAY2 and WAY3 may input/output data in the interleaving scheme by sharing the first channel CH1.

The first plane PLANE00 of the first memory die DIE0 may include a predetermined number of memory blocks BLOCK000 to BLOCK00N among the plurality of memory blocks in all of the planes.

The second plane PLANE01 of the first memory die DIE0 may include a predetermined number of memory blocks BLOCK010 to BLOCK01N among the plurality of memory blocks in all of the planes.

The first plane PLANE10 of the second memory die DIE1 may include a predetermined number of memory blocks BLOCK100 to BLOCK10N among the plurality of memory blocks in all of the planes.

The second plane PLANE11 of the second memory die DIE1 may include a predetermined number of memory blocks BLOCK110 to BLOCK11N among the plurality of memory blocks in all of the planes.

In this manner, the plurality of memory blocks BLOCK000 to BLOCK00N, BLOCK010 to BLOCK01N, BLOCK100 to BLOCK10N and BLOCK110 to BLOCK11N may be divided into groups, according to their physical locations and their use of the same ways and channels.

FIG. 5 shows a particular exemplary arrangement of memory dies, planes, and memory blocks. However, the present invention is not limited to this arrangement. In practice, more or less than two memory dies may be included in the memory device 150, more or less than two planes may be included in the respective memory dies, according to system design. In addition, the predetermined number of memory blocks included in the respective planes may be also adjusted variously according to system design.

Instead of dividing the plurality of memory blocks BLOCK000 to BLOCK00N, BLOCK010 to BLOCK01N, BLOCK100 to BLOCK10N and BLOCK110 to BLOCK11N based on their physical locations such as the memory dies DIE0 and DIE1 or the planes PLANE00 and PLANE01/PLANE10 and PLANE11, the controller 130 may divide the plurality of memory blocks BLOCK000 to BLOCK00N, BLOCK010 to BLOCK01N, BLOCK100 to BLOCK10N and BLOCK110 to BLOCK11N on a basis of memory blocks which are simultaneously selected and operate. In other words, the controller 130 may manage a plurality of memory blocks which are located in different dies or different planes based on their physical locations, by grouping memory blocks capable of being selected simultaneously and thereby dividing the grouped memory blocks into super memory blocks.

The simultaneous selection scheme of grouping the memory blocks into super memory blocks by the controller 130 may be performed in various ways according to system design. Three exemplary simultaneous selection schemes will be described below.

A first scheme is to group an arbitrary memory block BLOCK000 from the first plane PLANE00 and an arbitrary memory block BLOCK010 from the second plane PLANE01 of the first memory die DIE0 manage the grouped memory blocks BLOCK000 and BLOCK010 as a single super memory block A1. When the first scheme is applied to the second memory die DIE1, the controller 130 may group an arbitrary memory block BLOCK100 from the first plane PLANE10 and an arbitrary memory block BLOCK110 from the second plane PLANE11 of the second memory die DIE1 and manage the grouped memory blocks BLOCK100 and BLOCK110 as a single super memory block A2.

A second scheme is to group an arbitrary memory block BLOCK002 from the first plane PLANE00 of the first memory die DIE0 and an arbitrary memory block BLOCK102 from the first plane PLANE10 of the second memory die DIE1 and manage the grouped memory blocks BLOCK002 and BLOCK102 as a single super memory block B1. In addition, according to the second scheme, the controller 130 may group an arbitrary memory block BLOCK012 from the second plane PLANE01 of the first memory die DIE0 and an arbitrary memory block BLOCK112 from the second plane PLANE11 of the second memory die DIE1 and manage the grouped memory blocks BLOCK012 and BLOCK112 as a single super memory block B2.

A third scheme is to group an arbitrary memory block BLOCK001 from the first plane PLANE00 of the first memory die DIE0, an arbitrary memory block BLOCK011 from the second plane PLANE01 of the first memory die DIE0, an arbitrary memory block BLOCK101 from the first plane PLANE10 of the second memory die DIE1, and an arbitrary memory block BLOCK111 from the second plane PLANE11 of the second memory die DIE1 and manage the grouped memory blocks BLOCK001, BLOCK011, BLOCK101 and BLOCK111 as a single super memory block C.

The simultaneously-selectable memory blocks in the respective super memory blocks may be substantially simultaneously selected by the controller 130 through an interleaving scheme, for example, a channel interleaving scheme, a memory die interleaving scheme, a memory chip interleaving scheme or a way interleaving scheme.

Figure 6:
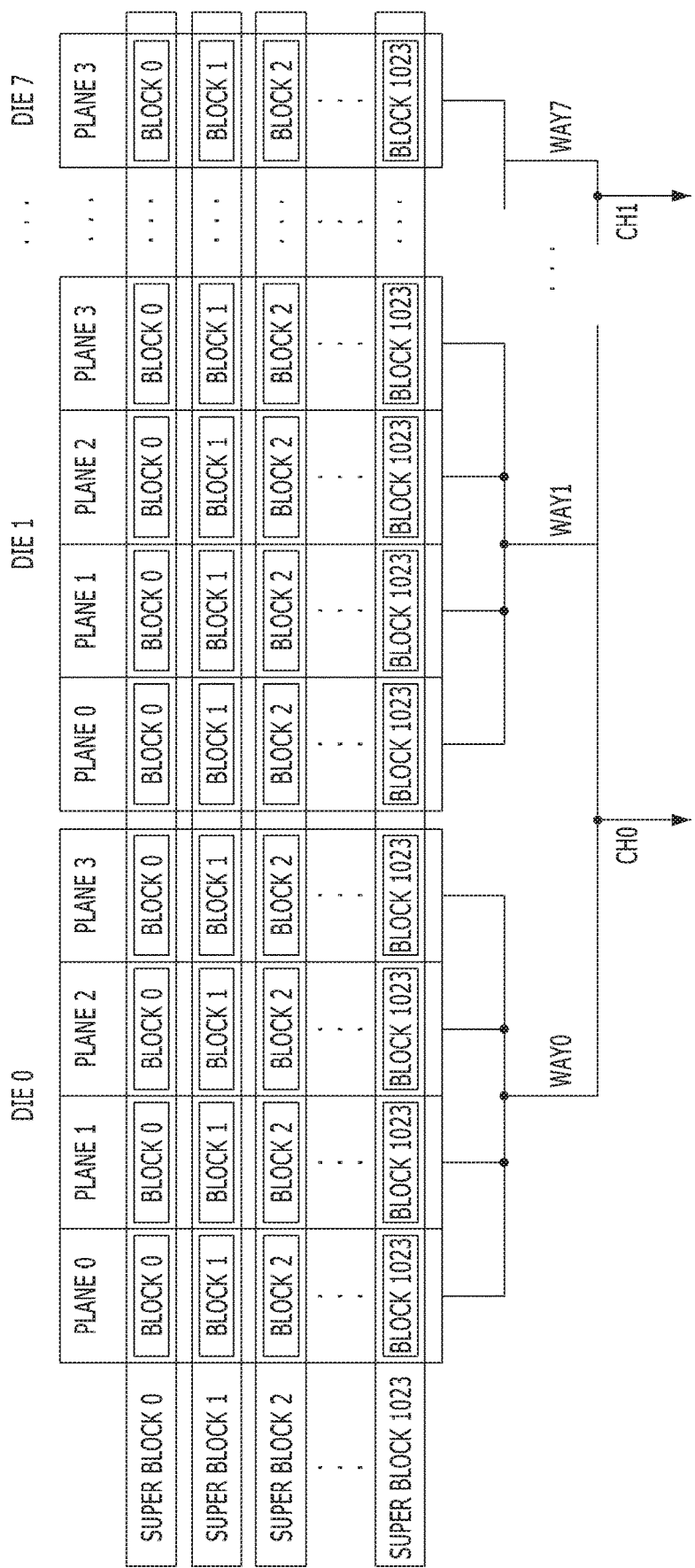
FIG. 6 is a diagram illustrating an operation of managing memory blocks in units of super memory blocks in a memory system in accordance with an embodiment of the present invention.

FIG. 6 is a diagram illustrating an operation of managing memory blocks in units of super memory blocks in the memory system 110 in accordance with an embodiment of the present invention.

Referring to FIG. 6, when the controller 130 manages a plurality of memory blocks in the memory device 150 by dividing the memory blocks into a plurality of super memory blocks, a scheme of selecting each of the super memory blocks may be applied.

As shown in the drawing, the memory device 150 may include eight memory dies DIE<0:7>. Each of the eight memory dies DIE<0:7> may include four planes PLANE<0:3>, and thus the memory device 150 may include a total of 32 planes PLANE<0:3>*8. Each of the 32 planes may include 1024 memory blocks BLOCK<0:1023>. That is, the memory device 150 may include a total of 32768 memory blocks BLOCK<0:1023>*32.

Thus, as illustrated in FIG. 6, in the memory device 150, the 32 planes PLANE<0:3>*8 in the eight memory dies DIE<0:7> input/output data through two channels CH<0:1> and eight ways WAY<0:7>. More particularly, it is shown that four ways WAY<0:3> or WAY<4:7> share one channel CH0 or CH1, and the four planes PLANE<0:3> share one way WAY0, WAY1, WAY2, WAY3, WAY4, WAY5, WAY6 or WAY7.

The controller 130 of the memory system 110 may manage the plurality of memory blocks in the memory device 150, by dividing them into super memory blocks. Particularly, the controller 130 in accordance with an embodiment of the present invention shown in FIG. 6 uses the third scheme among the three simultaneous selection schemes of dividing the memory blocks into the super memory blocks, which are described earlier with reference to FIG. 5.

That is, the controller 130 shown in FIG. 6 may select an arbitrary memory block from each of the 32 planes PLANE<0:3>*8 and manage the selected memory blocks as a single super memory block SUPER BLOCK0, SUPER BLOCK1, SUPER BLOCK2, . . . , or SUPER BLOCK1023. Accordingly, each of the super memory blocks SUPER BLOCK<0:1023> may include 32 memory blocks.

Since the controller 130 simultaneously selects the 32 memory blocks in each of the super memory blocks SUPER BLOCK<0:1023>, the controller 130 may use a super memory block address (not illustrated) for selecting each of the super memory blocks SUPER BLOCK<0:1023> in a structure where the memory blocks are managed in units of super memory blocks as shown in FIG. 6.

In order to use the super memory block address, the controller 130 may use a scheme to group memory blocks being at the same location from each of the 32 planes PLANE<0:3>*8 and manage the grouped memory blocks as the super memory block.

For example, the controller 130 may group 32 zeroth memory blocks BLOCK0 from each of the 32 planes PLANE<0:3>*8 and manage the grouped 32 zeroth memory blocks BLOCK0 as a zeroth super memory block SUPER BLOCK0, group 32 first memory blocks BLOCK1 from each of the 32 planes PLANE<0:3>*8 and manage the grouped 32 first memory blocks BLOCK1 as a first super memory block SUPER BLOCK1, and group 32 second memory blocks BLOCK2 from each of the 32 planes PLANE<0:3>*8 and manage the grouped 32 second memory blocks BLOCK2 as a second super memory block SUPER BLOCK2. In this manner, the controller 130 may manage the 32768 memory blocks BLOCK<0:1023>*32 by dividing them into total 1024 super memory blocks SUPER BLOCK<0:1023>.

The fact that the controller 130 manages the memory blocks BLOCK<0:1023>*32 by dividing them into the super memory blocks SUPER BLOCK<0:1023> may mean that the controller 130 processes in units of super memory blocks when an access operation is performed. In other words, just because the controller 130 uses the super memory block address to select each of the super memory blocks SUPER BLOCK<0:1023> does not mean that a memory block address for selecting each of the 32768 memory blocks BLOCK<0:1023>*32 is not used, and the memory block address may be continuously used in the controller 130. For example, when the controller 130 accesses the zeroth super memory block SUPER BLOCK0 through a zeroth super memory block address, it may mean that the controller 130 accesses at one time 32 memory block addresses corresponding to the 32 zeroth memory blocks BLOCK0 grouped into the zeroth super memory block SUPER BLOCK0.

In actuality, it may be impossible for all the memory blocks in the memory device 150 to operate normally. That is, when the memory device 150 is used in the implementation, a bad memory block that does not normally operate may be generated. A memory block having low durability among the plurality of memory blocks may be designated as the bad memory block because a normal operation is not performed even when a predetermined limit life is not reached.

However, when the controller 130 uses the scheme to group the memory blocks at the same location from each of the 32 planes PLANE<0:3>*8 and manage the grouped memory blocks as the super memory block in order to use the super memory block address as described above, a super memory block including the bad memory block among the super memory blocks SUPER BLOCK<0:1023> may not operate normally. That is, when even one of the 32 memory blocks in any of the super memory blocks SUPER BLOCK<0:1023> is determined as the bad memory block, the corresponding super memory block(s) may not operate normally.

Although only one among the 32 memory blocks in a super memory block is a bad memory block, and the other 31 memory blocks are all normal, it is highly inefficient for the super memory block to not be used normally.

Figure 7B:
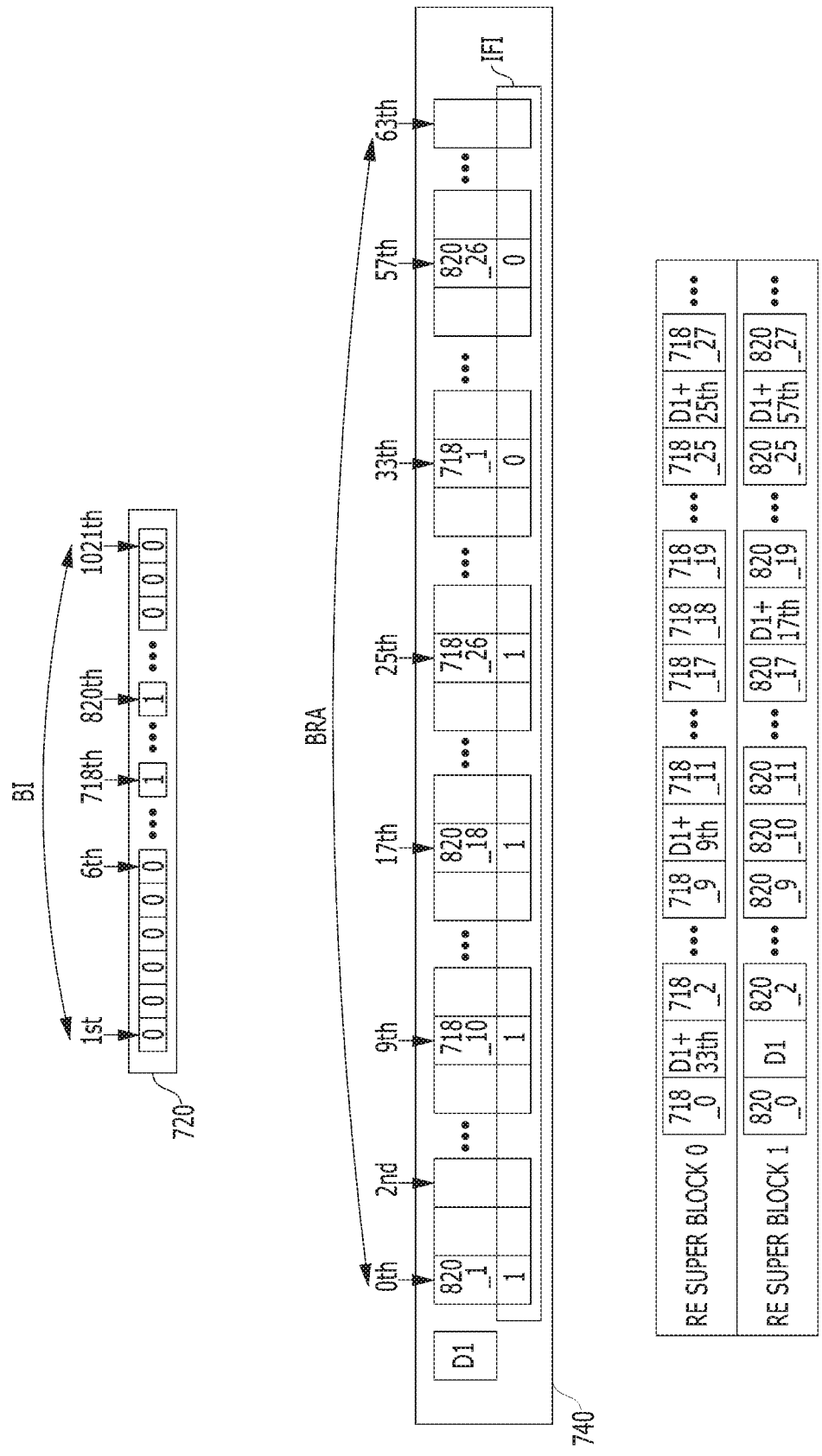

Therefore, the memory system 110 in accordance with an embodiment of the present invention may use bad occurrence information 720 and replacement information 740 shown in FIG. 7B to reuse a super memory block in which one or more memory blocks are bad memory block(s).

FIGS. 7A and 7B are diagrams illustrating a method of recovering a super memory block including bad memory block(s) in the memory system 110 in accordance with an embodiment of the present invention.

Referring to FIG. 7A, some memory blocks BLOCK<0: 1021>*32 among the plurality of memory blocks BLOCK<0:1023>*32 may be managed as super memory blocks SUPER BLOCK<0:1021>. Each of the super memory blocks SUPER BLOCK<0:1021> may be formed of 32 memory blocks which are selected respectively from the 32 planes PLANE<0:3>*8.

Also, remaining memory blocks BLOCK<D1:D64> may not be managed as super memory blocks but may be managed in a replacement block pool 700.

That is, in the memory system 110 in accordance with the embodiment of the present invention, the memory blocks BLOCK<D1:D64> may be separated from the memory blocks BLOCK<0:1023>*32 and may be managed in the replacement block pool 700.

As shown in FIG. 7A, the memory blocks BLOCK<D1: D64> managed in the replacement block pool 700 may include normal memory blocks BLOCK<D1, D3:D32> which are not capable of being divided into a super memory block due to a bad memory block BLOCK<D2>, and may include normal memory blocks BLOCK<D33:D64> in whole, which are capable of being divided into a super memory block. That is, what kind of and how many memory blocks are included and managed in the replacement block pool 700 may be differently determined according to the system design.

It may be seen that the memory blocks BLOCK<0: 1021>*32 among the memory blocks BLOCK<0:1023>*32 are managed as the super memory blocks SUPER BLOCK<0:1021>, and some of 32 memory blocks in each of a $718^{th}$ super memory block SUPER BLOCK 718 and a $820^{th}$ super memory block SUPER BLOCK 820 are determined as the bad memory blocks.

The bad memory blocks are not necessarily in each of the $718^{th}$ super memory block SUPER BLOCK 718 and the $820^{th}$ super memory block SUPER BLOCK 820 when the memory system 110 is manufactured. In other words, when the memory system 110 is manufactured, all the memory blocks in the $718^{th}$ super memory block SUPER BLOCK 718 and the $820^{th}$ super memory block SUPER BLOCK 820 may operate normally, but when the access operation is repeatedly performed on these super memory blocks in a mounted state, some memory blocks with low durability in those super memory blocks may be become bad memory blocks that are unable to perform the normal operation.

When the bad memory blocks are in each of the $718^{th}$ super memory block SUPER BLOCK 718 and the $820^{th}$ super memory block SUPER BLOCK 820 at the time the memory system 110 is manufactured, it is highly likely that the $718^{th}$ super memory block SUPER BLOCK 718 and the $820^{th}$ super memory block SUPER BLOCK 820 are managed in the replacement block pool 700 from the beginning. In other words, as described above, what kind of and how many memory blocks are included and managed in the replacement block pool 700 may be determined according to the system design, but in general, it is highly likely that memory blocks in the normal state, which are unable to be divided into the super memory blocks, are managed in the replacement block pool 700.

Specifically, it may be seen that a memory block in a first plane PLANE1 of a zeroth memory die DIE0 among the 32 memory blocks in the $718^{th}$ super memory block SUPER BLOCK 718 is determined as a bad memory block, a memory block in a first plane PLANE1 of a first memory die DIE1 is determined as a bad memory block, a memory block in a first plane PLANE1 of a fourth memory die DIE4 is determined as a bad memory block, and the remaining 29 memory blocks are normal memory blocks.

Also, it may be seen that a memory block in a first plane PLANE1 of a zeroth memory die DIE0 among the 32 memory blocks in the $820^{th}$ super memory block SUPER BLOCK 820 is determined as a bad memory block, a memory block in a first plane PLANE1 of a third memory die DIE3 is determined as a bad memory block, a memory block in a first plane PLANE1 of a fourth memory die DIE4 is determined as a bad memory block, and the remaining 29 memory blocks are normal memory blocks.

In this state, the controller 130, as shown in FIG. 7B, may replace the bad memory blocks in each of the $718^{th}$ super memory block SUPER BLOCK 718 and the $820^{th}$ super memory block SUPER BLOCK 820 which are determined as the bad super memory blocks with the normal memory blocks BLOCK<D1, D3:D64> managed in the replacement block pool 700, and manage them as recovery super memory blocks RE SUPER BLOCK<0:1>.

Specifically, referring to FIGS. 7A and 7B, the controller 130 may use the bad occurrence information 720 in bitmap form to manage information that divides the super memory blocks SUPER BLOCK<0:1021> into normal super memory blocks SUPER BLOCK<0:717, 719:819, 821:

1021> and bad super memory blocks SUPER BLOCK<718, 820>. That is, the controller 130 may manage the super memory blocks SUPER BLOCK<0:1021> through the bad occurrence information 720 in the bitmap form to determine whether the super memory blocks SUPER BLOCK<0: 1021> have to be divided into the normal super memory blocks SUPER BLOCK<0:717, 719:819, 821:1021> and the bad super memory blocks SUPER BLOCK<718, 820>. For example, in order to manage the 1021 super memory blocks SUPER BLOCK<0:1021>, a total of 1021 information bits BI{1st:1021th} may be included in the bitmap representing the bad occurrence information 720, and in order to indicate that the 718$^{th}$ super memory block SUPER BLOCK 718 and the 820$^{th}$ super memory block SUPER BLOCK 820 are determined as the bad super memory blocks SUPER BLOCK<718, 820>, a 718$^{th}$ information bit BI{718$^{th}$} and a 820$^{th}$ information bit BI{820$^{th}$} among the 1021 information bits BI{1st:1021th} in the bad occurrence information 720 may have a value "1", and the remaining 1019 information bits BI{1st:717th, 719th:819th, 821th:1021th} may have a value "0".

Accordingly, when accessing the super memory blocks SUPER BLOCK<0:1021> according to a request of the host 102, the controller 130 may check the bad occurrence information 720 to determine whether any super memory blocks requested to be accessed by the host 102 is one of the bad super memory blocks SUPER BLOCK<718, 820> or one of the normal super memory blocks SUPER BLOCK<0: 717, 719:819, 821:1021>.

When the super memory blocks that are requested to be accessed from the host 102 are determined as the normal super memory blocks SUPER BLOCK<0:717, 719:819, 821:1021> as a result of checking the bad occurrence information 720, the controller 130 may use the super memory block address to access the normal super memory blocks SUPER BLOCK<0:717, 719:819, 821:1021> as described above with reference with FIG. 6.

When the super memory blocks that are requested to be accessed from the host 102 are determined as the bad super memory blocks SUPER BLOCK<718, 820> as a result of checking the bad occurrence information 720, the controller 130 may use the replacement information 740 to change the bad super memory blocks SUPER BLOCK<718, 820> to the recovery super memory blocks RE SUPER BLOCK<0: 1>. The replacement information 740 may be for replacing bad memory blocks BLOCK 718_1, BLOCK 718_10, BLOCK 718_26, BLOCK 820_1, BLOCK 820_18 and BLOCK 820_26 with normal memory blocks D34, D10, D26, D1, D18 and D58 in the replacement block pool 700 and putting the normal memory blocks D34, D10, D26, D1, D18 and D58 into the recovery super memory blocks RE SUPER BLOCK<0:1>.

To sum up, the controller 130 may group the memory blocks BLOCK<0:1023>*32 in the memory device 150 in the scheme described with reference to FIGS. 5 and 6 and manage the grouped memory blocks as the super memory blocks SUPER BLOCK<0:1021>, and may manage the normal memory blocks BLOCK<D1, D3:D64> which are not grouped into the super memory blocks SUPER BLOCK<0:1021> among the memory blocks BLOCK<0: 1023>*32 in the replacement block pool 700.

Also, the controller 130 may set the super memory blocks SUPER BLOCK<718, 820> including the bad memory blocks BLOCK 718_1, BLOCK 718_10, BLOCK 718_26, BLOCK 820_1, BLOCK 820_18 and BLOCK 820_26 among the super memory blocks SUPER BLOCK<0:1021> as the bad super memory blocks SUPER BLOCK<718, 820>.

The controller 130 may use the bad occurrence information 720 in bitmap form to manage the information that divides the super memory blocks SUPER BLOCK<0:1021> into the normal super memory blocks SUPER BLOCK<0: 717, 719:819, 821:1021> and the bad super memory blocks SUPER BLOCK<718, 820>.

Also, the controller 130 may use the replacement information 740 to replace the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> with the normal memory blocks D34, D10, D26, D1, D18 and D58 in the replacement block pool 700, thereby making the normal memory blocks D34, D10, D26, D1, D18 and D58 as part of the recovery super memory blocks RE SUPER BLOCK<0: 1>.

A method of using the replacement information 740 is described below with a specific example.

Physical tables BRA{0th:63th} for indicating physical addresses of all the respective memory blocks BLOCK<D1: D64> in the replacement block pool 700 may be included in index form in the replacement information 740. For example, as shown in FIG. 7A, a total of 64 memory blocks BLOCK<D1:D64> may be included in the replacement block pool 700, and thus 64 physical tables BRA{0th:63th} for indicating the physical addresses of the respective memory blocks BLOCK<D1:D64> may be included in index form in the replacement information 740.

To facilitate managing the physical addresses of the memory blocks in the replacement block pool 700, the physical tables BRA{0th:63th} may be configured such that the physical address of one block is stored and the physical addresses of the remaining memory blocks in the replacement block pool 700 are indicated and so included in the replacement information 740. In other words, since just a physical address D1 of a first memory block BLOCK<D1> having a foremost physical address among the memory blocks BLOCK<D1:D64> in the replacement block pool 700 is stored in the replacement information 740, and physical addresses of the remaining second to 64$^{th}$ memory blocks BLOCK<D2:D64> are calculated based on the physical address of the first memory block BLOCK<D1>, the physical tables BRA{0th:63th} not for storing but for indicating the physical addresses of the memory blocks BLOCK<D1:D64> in the replacement block pool 700 may be included in the replacement information 740.

For example, a physical address of a third memory block BLOCK<D3> in the replacement block pool 700 may be a physical address D1+2nd which is different by two units from the physical address D1 of the first memory block BLOCK<D1>. In order to indicate the physical address D1+2nd, a physical table BRA{2nd} in a third order among the physical tables BRA{0th:63th} included in the replacement information 740 may correspond to the third memory block BLOCK<D3>.

Similarly, a physical address of a 10$^{th}$ memory block BLOCK<D10> in the replacement block pool 700 may be a physical address D1+9th which is different by nine units from the physical address D1 of the first memory block BLOCK<D1>. In order to indicate the physical address D1+9th, a physical table BRA{9th} in a 10th order among the physical tables BRA{0th:63th} included in the replacement information 740 may correspond to the 10$^{th}$ memory block BLOCK<D10>.

Also, a physical table BRA{0th} in a first order, which corresponds the first memory block BLOCK<D1> and indicates a physical address which is not different from the physical address D1 of the first memory block BLOCK<D1>, may be included in the physical tables BRA{0th:63th} in the replacement information 740.

As shown above, a memory block corresponding to a physical table in the replacement block pool 700 and a physical address of a corresponding memory block may be determined depending on locations of the physical tables BRA{0th:63th} in the replacement information 740.

When the memory system 110 is initially manufactured, that is, when all the super memory blocks SUPER BLOCK<0:1021> in the memory device 150 operate as normal super memory blocks, no value may be stored in the physical tables BRA{0th:63th} in the replacement information 740. In other words, at the time the memory system 110 is initially manufactured, the physical tables BRA{0th:63th} in the replacement information 740 may be empty.

However, a specific value may be stored in the physical tables BRA{0th:63th} in the replacement information 740 when starting to manage the bad super memory blocks SUPER BLOCK<718, 820>. That is, physical addresses 718_1, 718_10, 718_26, 820_1, 820_18 and 820_26 of the bad memory blocks BLOCK 718_1, BLOCK 718_10, BLOCK 718_26, BLOCK 820_1, BLOCK 820_18 and BLOCK 820_26 may be stored in physical tables BRA{33th, 9th, 25th, 0th, 17th, 57th} corresponding to the normal memory blocks D34, D10, D26, D1, D18 and D58 of the replacement block pool 700 used for replacing the above-identified bad memory blocks in the bad super memory blocks SUPER BLOCK<718, 820> among the physical tables BRA{0th:63th} in the replacement information 740.

Flag information IFI indicating whether each of the normal memory blocks D34, D10, D26, D1, D18 and D58 of the replacement block pool 700, which correspond to the corresponding physical tables BRA{33th, 9th, 25th, 0th, 17th, 57th}, suitable for an interleaving operation of the recovery super memory blocks RE SUPER BLOCK <0:1>, may be included in bitmap form in the physical table BRA{33th, 9th, 25th, 0th, 17th, 57th} where the physical addresses 718_1, 718_10, 718_26, 820_1, 820_18 and 820_26 of the bad memory blocks BLOCK 718_1, BLOCK 718_10, BLOCK 718_26, BLOCK 820_1, BLOCK 820_18 and BLOCK 820_26 are stored.

In this manner, the flag information FIN along with the physical addresses 718_1, 718_10, 718_26, 820_1, 820_18 and 820_26 of the bad memory blocks BLOCK 718_1, BLOCK 718_10, BLOCK 718_26, BLOCK 820_1, BLOCK 820_18 and BLOCK 820_26 may be stored in the replacement information 740. The reason why the flag information IFI has to be stored in the replacement information 740 may be that the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> are replaced with the normal memory blocks D34, D10, D26, D1, D18 and D58 in the replacement block pool 700, and then an access method of the recovery super memory blocks RE SUPER BLOCK <0:1> varies depending on whether or not the interleaving operation is possible. Accordingly, when the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> are replaced with the normal memory blocks D34, D10, D26, D1, D18 and D58 in the replacement block pool 700, the following conditions may be checked.

As shown in FIG. 7A, a case where the six bad memory blocks BLOCK 718_1, BLOCK 718_10, BLOCK 718_26, BLOCK 820_1, BLOCK 820_18 and BLOCK 820_26 are in the two bad super memory blocks SUPER BLOCK<718, 820> among the super memory blocks SUPER BLOCK<0:1021> will be described by way of example.

In order to reuse the $718^{th}$ super memory block SUPER BLOCK 718 that is determined as a bad super memory block, the controller 130 may retrieve the normal memory blocks D34, D10 and D26 capable of replacing the memory block BLOCK 718_1 in the first plane PLANE1 of the zeroth memory die DIE0, the memory block BLOCK 718_10 in the first plane PLANE1 of the first memory die DIE1 and the memory block BLOCK 718_26 in the first plane PLANE1 of the fourth memory die DIE4 from the normal memory blocks BLOCK<D1, D3:D64> in the replacement block pool 700.

In addition, in order to reuse the $820^{th}$ super memory block SUPER BLOCK 820 that is determined as a bad super memory block, the controller 130 may retrieve the normal memory blocks D1, D18 and D58 capable of replacing the memory block BLOCK 820_1 in the first plane PLANE1 of the zeroth memory die DIE0, the memory block BLOCK 820_18 in the first plane PLANE1 of the third memory die DIE3 and the memory block BLOCK 820_26 in the first plane PLANE1 of the fourth memory die DIE4 from the normal memory blocks BLOCK<D1, D3:D64> in the replacement block pool 700.

A first priority of a condition for retrieving the replacement memory blocks D34, D10, D26, D1, D18 and D58 for replacing the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> among the normal memory blocks BLOCK<D1, D3:D64> managed in the replacement block pool 700 may be whether or not the bad memory blocks BLOCK 718_1, BLOCK 718_10, BLOCK 718_26, BLOCK 820_1, BLOCK 820_18 and BLOCK 820_26 operate in the interleaving scheme even in a state of being managed in the recovery super memory blocks RE SUPER BLOCK <0:1> through the normal memory blocks BLOCK<D1, D3:D64> in the replacement block pool 700. That is, as described above with reference to FIG. 5, when two or more memory blocks included in a single plane PLANE0 or PLANE1 are included in a single super memory block, the single super memory block may not operate in the interleaving scheme.

Therefore, when retrieving the replacement memory blocks D34, D10, D26, D1, D18 and D58 for replacing the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820>, the controller 130 may check the physical locations of the bad memory blocks BLOCK 718_1, BLOCK 718_10, BLOCK 718_26, BLOCK 820_1, BLOCK 820_18 and BLOCK 820_26 as the first priority. In other words, the controller 130 may check corresponding dies and planes in which the bad memory blocks BLOCK 718_1, BLOCK 718_10, BLOCK 718_26, BLOCK 820_1, BLOCK 820_18 and BLOCK 820_26 are included, as the first priority. Subsequently, the controller 130 may select normal memory blocks having the same physical locations as the bad memory blocks BLOCK 718_1, BLOCK 718_10, BLOCK 718_26, BLOCK 820_1, BLOCK 820_18 and BLOCK 820_26 from the normal memory blocks BLOCK<D1, D3:D64> in the replacement block pool 700.

When the aforementioned condition of the first priority is not satisfied, that is, when the normal memory blocks having the same physical locations as the bad memory blocks BLOCK 718_1, BLOCK 718_10, BLOCK 718_26, BLOCK 820_1, BLOCK 820_18 and BLOCK 820_26 are not, according to the check, in the normal memory blocks BLOCK<D1, D3:D64> of the replacement block pool 700, the normal memory blocks BLOCK<D1, D3:D64> managed in the replacement block pool 700 may be retrieved according to a second priority. The second priority may be whether or not it is possible for the bad super memory blocks SUPER BLOCK<718, 820> become the recovery super memory blocks RE SUPER BLOCK<0:1> by replacing bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> with the normal memory blocks BLOCK<D1, D3:D64> of the replacement block pool 700. A predetermined number of normal memory blocks, for example, the 32 normal memory blocks as shown in the drawing are included in a single recovery super memory block RE SUPER BLOCK <0 or 1>. For this reason, when all the normal memory blocks BLOCK<D1, D3:D64> in the replacement block pool 700 are used as the replacement memory blocks, there may be no normal memory blocks capable of replacing the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820>, and thus it may be impossible to generate the recovery super block RE SUPER BLOCK<0:1> for the bad super memory blocks SUPER BLOCK<718, 820>.

Accordingly, if the first priority described above is not satisfied when retrieving the normal memory blocks BLOCK<D1, D3:D64> managed in the replacement block pool 700, the controller 130 may check the second priority, that is, whether or not the normal memory blocks capable of replacing the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> are in the normal memory blocks BLOCK<D1, D3:D64> of the replacement block pool 700, and may use the normal memory blocks of the replacement block pool 700 according to a result of the checking to replace the bad memory blocks identified above.

When checking the second priority, that is, whether or not the normal memory blocks capable of replacing the bad memory blocks BLOCK 718_1, BLOCK 718_10, BLOCK 718_26, BLOCK 820_1, BLOCK 820_18 and BLOCK 820_26 in the bad super memory blocks SUPER BLOCK<718, 820> are in the normal memory blocks BLOCK<D1, D3:D64> of the replacement block pool 700, the controller 130 may check normal memory blocks which are relatively and physically close to those bad memory blocks from the normal memory blocks BLOCK<D1, D3:D64> of the replacement block pool 700.

For example, it may be assumed that the bad memory blocks are included in the first plane PLANE1 of the zeroth memory die DIE0, and just the normal memory block BLOCK D1 included in the zeroth plane PLANE) of the zeroth memory die DIE0 and the normal memory block BLOCK D9 included in the zeroth plane PLANE) of the first memory die DIE1 are included in the replacement block pool 700. In this state, the normal memory block of the replacement block pool 700, which is relatively and physically close to the bad memory blocks, that is, the normal memory block BLOCK D1 from the replacement block pool 700 may be selected to replace the bad memory blocks in the first plane PLANE1 of the zeroth memory die DIE0.

As a result of the checking, when the normal memory blocks capable of replacing the bad memory blocks of the bad super memory blocks SUPER BLOCK<718, 820> are not in the normal memory blocks BLOCK<D1, D3:D64> of the replacement block pool 700, the bad super memory blocks SUPER BLOCK<718, 820> may not be changed to the recovery super memory blocks RE SUPER BLOCK<0:1>, and the bad super memory blocks SUPER BLOCK<718, 820> may no longer operate as normal super memory blocks.

It will be described below how the controller 130 changes the $718^{th}$ super memory block SUPER BLOCK 718 and $820^{th}$ super memory block SUPER BLOCK 820, which are determined as the bad super memory blocks among the super memory blocks SUPER BLOCK<0:1021>, into the recovery super memory blocks RE SUPER BLOCK<0:1>, through the first and second priorities of the condition for retrieving the normal memory blocks BLOCK<D1, D3:D64> managed in the replacement block pool 700 as described above.

The controller 130 may retrieve the normal memory blocks BLOCK<D1, D3:D64> of the replacement block pool 700 based on the condition of the first priority in order to replace the bad memory blocks BLOCK 718_1, BLOCK 718_10 and BLOCK 718_26 in the $718^{th}$ super memory block SUPER BLOCK 718, that is, the memory block BLOCK 718_1 in the first plane PLANE1 of the zeroth memory die DIE0, the memory block BLOCK 718_10 in the first plane PLANE1 of the first memory die DIE1 and the memory block BLOCK 718_26 in the first plane PLANE1 of the fourth memory die DIE4.

As a result of the retrieval, the controller 130 may check that the normal memory block D34 exists in the first plane PLANE1 of the zeroth memory die DIE0, and use the normal memory block D34 to replace the bad memory block BLOCK 718_1 in the first plane PLANE1 of the zeroth memory die DIE0 of the $718^{th}$ super memory block SUPER BLOCK 718.

In order to change the $718^{th}$ super memory block SUPER BLOCK 718 to the zeroth recovery super memory block RE SUPER BLOCK<0> by replacing the bad memory block BLOCK 718_1 in the $718^{th}$ super memory block SUPER BLOCK 718 with the $34^{th}$ memory block D34 of the replacement block pool 700, the controller 130 may store a physical address 718_1 of the bad memory block BLOCK 718_1 in a $34^{th}$ physical table BRA{$33^{th}$} among the physical tables BRA{$0^{th}$:$63^{th}$} of the replacement information 740 corresponding to the $34^{th}$ memory block D34 among the memory blocks BLOCK<D1:D64> in the replacement block pool 700.

In addition, since the $34^{th}$ memory block D34 is retrieved based on the condition of the first priority, the flag information IFI having a first value "0" indicating that it is possible to perform the interleaving operation of the zeroth recovery super memory block RE SUPER BLOCK<0> with the $34^{th}$ memory block D34 of the replacement block pool 700 may be included in the $34^{th}$ physical table BRA{33th} among the physical tables BRA{0th:63th} of the replacement information 740.

The controller 130 may check that the normal memory block D10 exists in the first plane PLANE1 of the first memory die DIE1 among the normal memory blocks BLOCK<D1, D3:D64> managed in the replacement block pool 700, and use the normal memory block D10 to replace the bad memory block BLOCK 718_10 in the first plane PLANE1 of the first memory die DIE0 of the 718$^{th}$ super memory block SUPER BLOCK 718.

In order to change the 718$^{th}$ super memory block SUPER BLOCK 718 into the zeroth recovery super memory block RE SUPER BLOCK<0> by replacing the bad memory block BLOCK 718_10 in the 718$^{th}$ super memory block SUPER BLOCK 718 with the 10$^{th}$ memory block D10 of the replacement block pool 700, the controller 130 may store a physical address 718_10 of the bad memory block BLOCK 718_10 in a 10$^{th}$ physical table BRA{9th} among the physical tables BRA{0th:63th} of the replacement information 740 corresponding to the 10$^{th}$ memory block D10 among the memory blocks BLOCK<D1:D64> in the replacement block pool 700.

In addition, since the 10$^{th}$ memory block D10 is retrieved based on the condition of the first priority, the flag information IFI having the first value "0" indicating that it is possible to perform the interleaving operation of the zeroth recovery super memory block RE SUPER BLOCK<0> with the 10$^{th}$ memory block D10 of the replacement block pool 700 may be included in the 10$^{th}$ physical table BRA{9th} among the physical tables BRA{0th:63th} of the replacement information 740.

The controller 130 may check that the normal memory block D26 exists in the first plane PLANE1 of the fourth memory die DIE4 among the normal memory blocks BLOCK<D1, D3:D64> managed in the replacement block pool 700, and use the normal memory block D26 to replace the bad memory block BLOCK 718_26 in the first plane PLANE1 of the fourth memory die DIE4 of the 718$^{th}$ super memory block SUPER BLOCK 718.

In order to change the 718$^{th}$ super memory block SUPER BLOCK 718 to the zeroth recovery super memory block RE SUPER BLOCK<0> by replacing the bad memory block BLOCK 718_26 in the 718$^{th}$ super memory block SUPER BLOCK 718 with the 26$^{th}$ memory block D26 of the replacement block pool 700, the controller 130 may store a physical address 718_26 of the bad memory block BLOCK 718_26 in a 26$^{th}$ physical table BRA{25th} among the physical tables BRA{0th:63th} of the replacement information 740 corresponding to the 26$^{th}$ memory block D26 among the memory blocks BLOCK<D1:D64> in the replacement block pool 700.

In addition, since the 26$^{th}$ memory block D26 is retrieved based on the condition of the first priority, the flag information IFI having the first value "0" indicating that it is possible to perform the interleaving operation of the zeroth recovery super memory block RE SUPER BLOCK<0> with the 26$^{th}$ memory block D26 of the replacement block pool 700 may be included in the 26$^{th}$ physical table BRA{25th} among the physical tables BRA{0th:63th} of the replacement information 740.

As described above, the bad memory blocks BLOCK 718_1, BLOCK 718_10 and BLOCK 718_26 in the 718$^{th}$ super memory block SUPER BLOCK 718 may be replaced using the 34$^{th}$ memory block D34, the 10$^{th}$ memory block D10 and the 26$^{th}$ memory block D26 among the normal memory blocks BLOCK<D1, D3:D64> managed in the replacement block pool 700, and information required for replacing these bad memory blocks may be stored in the replacement information 740. Accordingly, the 718$^{th}$ super memory block SUPER BLOCK 718 may be changed to the zeroth recovery super memory block RE SUPER BLOCK<0> through the replacement information 740. Also, since the flag information IFI is included in the replacement information 740, whether or not the interleaving operation of the zeroth recovery super memory block RE SUPER BLOCK<0> is possible may be determined through an operation of retrieving the replacement information 740.

A method of accessing the zeroth recovery super memory block RE SUPER BLOCK<0> in the controller 130 is described below.

When accessing the 718$^{th}$ super memory block SUPER BLOCK 718 according to a request of the host 102, the controller 130 may identify the 718$^{th}$ super memory block SUPER BLOCK 718 as a bad super memory block through the bad occurrence information 720. Accordingly, the controller 130 may not use the super memory block address when accessing the 718$^{th}$ super memory block SUPER BLOCK 718, and may check whether or not each of physical addresses 718_<0:31> of 32 memory blocks block 718_<0:31> in the 718$^{th}$ super memory block SUPER BLOCK 718 is stored in the physical tables BRA{0th:63th} of the replacement information 740.

For example, since a zeroth memory block BLOCK 718_0 in the 718$^{th}$ super memory block SUPER BLOCK 718 is not the bad memory block, a physical address 718_0 corresponding to the zeroth memory block BLOCK 718_0 may not be stored in the physical tables BRA{0th:63th} of the replacement information 740. Accordingly, the controller 130 may use the physical address 718_0 of the zeroth memory block BLOCK 718_0 as it is in the zeroth recovery super memory block RE SUPER BLOCK<0>. Since the first memory block BLOCK 718_1 in the 718$^{th}$ super memory block SUPER BLOCK 718 is a bad memory block, a physical address 718_1 corresponding to the first memory block BLOCK 718_1 may be stored in the 34$^{th}$ physical table BRA{33th} among the physical tables BRA{0th:63th} of the replacement information 740. Accordingly, the controller 130 may replace the physical address 718_1 of the first memory block BLOCK 718_1 with a physical address D1+33th of the normal memory block D34 used in the replacement block pool 700, and use the physical address D1+33th of the normal memory block D34 in the zeroth recovery super memory block RE SUPER BLOCK<0>.

In this manner, the controller 130 may replace physical addresses 718_1, 718_10 and 718_26 of the bad memory blocks BLOCK 718_1, BLOCK 718_10 and BLOCK 718_26 among the 32 memory blocks BLOCK 718_<0:31> in the 718$^{th}$ super memory block SUPER BLOCK 718 with physical addresses D1+33th, D1+9th and D1+25th of the normal memory blocks D34, D10 and D26 used in the replacement pool 700, and then regard the physical addresses D1+33th, D1+9th and D1+25th as those of normal memory blocks D34, D10 and D26 together with physical addresses 718_<0, 2:9, 11:25, 27:31> of remaining 29 normal memory blocks BLOCK 718_<0, 2:9, 11:25, 27:31> for the zeroth recovery super memory block RE SUPER BLOCK<0>, thereby accessing the zeroth recovery super memory block RE SUPER BLOCK<0>.

When the physical addresses 718_1, 718_10 and 718_26 of the bad memory blocks BLOCK 718_1, BLOCK 718_10 and BLOCK 718_26 in the 718$^{th}$ super memory block SUPER BLOCK 718 are retrieved in the physical tables BRA{33th, 9th, 25th} of the replacement information 740, the controller 130 may check values of the flag information IFI corresponding to the physical addresses 718_1, 718_10 and 718_26.

Since all the flag information IFI have the first value "0" as a result of the checking, it may be determined that the interleaving operation of the zeroth recovery super memory block RE SUPER BLOCK<0> is possible. Accordingly, when accessing the zeroth recovery super memory block RE SUPER BLOCK<0> to access the 718$^{th}$ super memory block SUPER BLOCK 718 according to the request of the host 102, the controller 130 may access the zeroth recovery super memory block RE SUPER BLOCK<0> using the interleaving scheme, similarly to other normal super memory blocks SUPER BLOCK<0:717, 719:819, 821: 1021>.

The controller 130 may retrieve the normal memory blocks BLOCK<D1, D3:D64> of the replacement block pool 700 based on the condition of the first priority in order to replace the bad memory blocks BLOCK 820_1, BLOCK 820_18 and BLOCK 820_26 in the 820$^{th}$ super memory block SUPER BLOCK 820, that is, the memory block BLOCK 820_1 in the first plane PLANE1 of the zeroth memory die DIE0, the memory block BLOCK 820_18 in the first plane PLANE1 of the third memory die DIE3 and the memory block BLOCK 820_26 in the first plane PLANE1 of the fourth memory die DIE4.

As a result of the retrieval, the controller 130 may determine that the normal memory block D34 has been already used to replace the bad memory block BLOCK 718_1 in the first plane PLANE1 of the zeroth memory die DIE0 of the 718$^{th}$ super memory block SUPER BLOCK 718. Thus, it is impossible to replace the bad memory block BLOCK 820_1 in the first plane PLANE1 of the zeroth memory die DIE0 of the 820$^{th}$ super memory block SUPER BLOCK 820 according to the condition of the first priority.

Accordingly, the controller 130 may retrieve the normal memory blocks BLOCK<D1, D3:D64> of the replacement block pool 700 again based on the condition of the second priority.

As a result of the retrieval, the controller 130 may determine that the normal memory block D1 exists in the zeroth plane PLANE0 of the zeroth memory die DIE0 among the normal memory blocks BLOCK<D1, D3:D64> managed in the replacement block pool 700, and use the normal memory block D1 to replace the bad memory block BLOCK 820_1 in the first plane PLANE1 of the zeroth memory die DIE0 of the 820$^{th}$ super memory block SUPER BLOCK 820.

In order to change the 820$^{th}$ super memory block SUPER BLOCK 820 to the first recovery super memory block RE SUPER BLOCK<1> by replacing the bad memory block BLOCK 820_1 in the 820$^{th}$ super memory block SUPER BLOCK 820 with the first memory block D1 of the replacement block pool 700, the controller 130 may store a physical address 820_1 of the bad memory block BLOCK 820_1 in a first physical table BRA{0th} among the physical tables BRA{0th:63th} of the replacement information 740 corresponding to the first memory block D1 among the memory blocks BLOCK<D1:D64> in the replacement block pool 700.

In addition, since the first memory block D1 is not retrieved based on the condition of the first priority but is retrieved based on the condition of the second priority, the flag information IFI having a second value "1" indicating that it is impossible to perform the interleaving operation of the first recovery super memory block RE SUPER BLOCK<1> with the first memory block D1 of the replacement block pool 700 may be included in the first physical table BRA{0th} among the physical tables BRA{0th: 63th} of the replacement information 740.

The controller 130 may determine that the normal memory block D18 exists in the first plane PLANE1 of the third memory die DIE3 among the normal memory blocks BLOCK<D1, D3:D64> managed in the replacement block pool 700, and use the normal memory block D18 to replace the bad memory block BLOCK 820_18 in the first plane PLANE1 of the third memory die DIE3 of the 820$^{th}$ super memory block SUPER BLOCK 820.

In order to change the 820$^{th}$ super memory block SUPER BLOCK 820 to the first recovery super memory block RE SUPER BLOCK<1> by replacing the bad memory block BLOCK 820_18 in the 820$^{th}$ super memory block SUPER BLOCK 820 with the 18$^{th}$ memory block D18 of the replacement block pool 700, the controller 130 may store a physical address 820_18 of the bad memory block BLOCK 820_18 in a 18$^{th}$ physical table BRA{17th} among the physical tables BRA{0th:63th} of the replacement information 740 corresponding to the 18$^{th}$ memory block D18 among the memory blocks BLOCK<D1:D64> in the replacement block pool 700.

In addition, since the 18$^{th}$ memory block D18 is retrieved based on the condition of the first priority, the flag information IFI having the first value "0" indicating that it is possible to perform the interleaving operation of the first recovery super memory block RE SUPER BLOCK<1> with the 18$^{th}$ memory block D18 of the replacement block pool 700 may be included in the 18$^{th}$ physical table BRA{17th} among the physical tables BRA{0th: 63th} of the replacement information 740.

The controller 130 may determine that the normal memory block D58 exists in the first plane PLANE1 of the fourth memory die DIE4 among the normal memory blocks BLOCK<D1, D3:D64> managed in the replacement block pool 700, and use the normal memory block D58 to replace the bad memory block BLOCK 820_26 in the first plane PLANE1 of the fourth memory die DIE4 of the 820$^{th}$ super memory block SUPER BLOCK 820.

In order to change the 820$^{th}$ super memory block SUPER BLOCK 820 to the first recovery super memory block RE SUPER BLOCK<1> by replacing the bad memory block BLOCK 820_26 in the 820$^{th}$ super memory block SUPER BLOCK 820 with the 58$^{th}$ memory block D58 of the replacement block pool 700, the controller 130 may store a physical address 820_26 of the bad memory block BLOCK 820_26 in a 58$^{th}$ physical table BRA{57th} among the physical tables BRA{0th:63th} of the replacement information 740 corresponding to the 58$^{th}$ memory block D58 among the memory blocks BLOCK<D1:D64> in the replacement block pool 700.

In addition, since the 58$^{th}$ memory block D58 is retrieved based on the condition of the first priority, the flag information IFI having the first value "0" indicating that it is possible to perform the interleaving operation of the first recovery super memory block RE SUPER BLOCK<1> with the 58$^{th}$ memory block D58 of the replacement block pool 700 may be included in the 58$^{th}$ physical table BRA{57th} among the physical tables BRA{0th:63th} of the replacement information 740.

As described above, the bad memory blocks BLOCK 820_1, BLOCK 820_18 and BLOCK 820_26 in the 820$^{th}$ super memory block SUPER BLOCK 820 may be replaced using the first memory block D1, the 18$^{th}$ memory block D18 and the 58$^{th}$ memory block D58 among the normal memory blocks BLOCK<D1, D3:D64> managed in the replacement block pool 700, and information required for replacing those bad memory blocks may be stored in the replacement information 740. Accordingly, the 820$^{th}$ super memory block SUPER BLOCK 820 may be changed to the first recovery super memory block RE SUPER BLOCK<1> through the replacement information 740.

Also, since the flag information IFI is included in the replacement information 740, whether or not the interleaving operation of the first recovery super memory block RE SUPER BLOCK<1> is possible may be determined quickly.

A method of accessing the first recovery super memory block RE SUPER BLOCK<l> in the controller 130 is described below.

When accessing the $820^{th}$ super memory block SUPER BLOCK 820 according to a request of the host 102, the controller 130 may identify the $820^{th}$ super memory block SUPER BLOCK 820 as a bad super memory block through the bad occurrence information 720. Accordingly, the controller 130 may not use the super memory block address when accessing the $820^{th}$ super memory block SUPER BLOCK 820, and may check whether or not each of physical addresses 820_<0:31> of 32 memory blocks BLOCK 820_<0:31> in the $820^{th}$ super memory block SUPER BLOCK 820 is stored in the physical tables BRA{0th:63th} of the replacement information 740.

For example, since a zeroth memory block BLOCK 820_0 in the $820^{th}$ super memory block SUPER BLOCK 820 is not the bad memory block, a physical address 820_0 corresponding to the zeroth memory block BLOCK 820_0 may not be stored in the physical tables BRA{0th:63th} of the replacement information 740. Accordingly, the controller 130 may use the physical address 820_0 of the zeroth memory block BLOCK 820_0 in the $820^{th}$ super memory block SUPER BLOCK 820 as it is in the first recovery super memory block RE SUPER BLOCK<1>. Since the first memory block BLOCK 820_1 in the $820^{th}$ super memory block SUPER BLOCK 820 is the bad memory block, a physical address 820_1 corresponding to the first memory block BLOCK 820_1 may be stored in the first physical table BRA{0th} among the physical tables BRA{0th:63th} of the replacement information 740. Accordingly, the controller 130 may replace the physical address 820_1 of the first memory block BLOCK 820_1 with a physical address D1 of the normal memory block D1 used in the replacement block pool 700, and use the physical address D1 of the normal memory block D1 in the first recovery super memory block RE SUPER BLOCK<1>.

In this manner, the controller 130 may replace physical addresses 820_1, 820_18 and 820_26 of the bad memory blocks BLOCK 820_1, BLOCK 820_18 and BLOCK 820_26 among the 32 memory blocks BLOCK 820_<0:31> in the $820^{th}$ super memory block SUPER BLOCK 820 with physical addresses D1, D1+17th and D1+57th of the normal memory blocks D1, D18 and D58 used in the replacement pool 700, and then regard the physical addresses D1, D1+17th and D1+57th as those of the normal memory blocks D1, D18 and D58 together with physical addresses 820_<0, 2:17, 19:25, 27:31> of remaining 29 normal memory blocks BLOCK 820_<0, 2:17, 19:25, 27:31> for the first recovery super memory block RE SUPER BLOCK<1>, thereby accessing the first recovery super memory block RE SUPER BLOCK<1>.

When the physical addresses 820_1, 820_18 and 820_26 of the bad memory blocks BLOCK 820_1, BLOCK 820_18 and BLOCK 820_26 in the $820^{th}$ super memory block SUPER BLOCK 820 are retrieved in the physical tables BRA{0th, 17th, 57th} of the replacement information 740, the controller 130 may check values of the flag information IFI corresponding to the physical addresses 820_1, 820_18 and 820_26.

Since the flag information IFI having the second value "1" is included in the flag information IFI as a result of the checking, it may be determined that the interleaving operation of the first recovery super memory block RE SUPER BLOCK<1> is impossible. Accordingly, when accessing the first recovery super memory block RE SUPER BLOCK<1> to access the $820^{th}$ super memory block SUPER BLOCK 820 according to the request of the host 102, the controller 130 may access the first recovery super memory block RE SUPER BLOCK<1> without using the interleaving scheme, differently from the other normal super memory blocks SUPER BLOCK<0:717, 719:819, 821:1021>.

To sum up, the controller 130 may check whether or not the interleaving operation of each of the recovery super memory blocks RE SUPER BLOCK<0:1> is possible, just through an operation of checking the replacement information 740, which is performed in a process of accessing the recovery super memory blocks RE SUPER BLOCK<0:1> to access the bad super memory blocks SUPER BLOCK<718, 820> according to the request of the host 102.

A data processing system and electronic devices to which the above-described memory system 110 including the memory device 150 and the controller 130 is applied in accordance with embodiments of the present invention will be described in detail with reference to FIGS. 8 to 16.

FIGS. 8 to 16 are diagrams schematically illustrating application examples of the data processing system of FIGS. 1 to 7B according to various embodiments.

Figure 8:
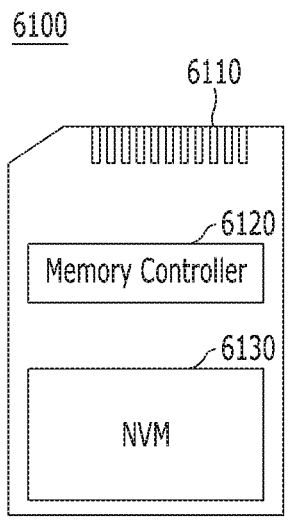
FIGS. 8 to 16 are diagrams schematically illustrating exemplary applications of the data processing system, in accordance with various embodiments of the present invention.

FIG. 8 is a diagram schematically illustrating an example of the data processing system including the memory system in accordance with a present embodiment. FIG. 8 schematically illustrates a memory card system to which the memory system in accordance with a present embodiment is applied.

Referring to FIG. 8, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 6, and the memory device 6130 may correspond to the memory device 150 of the memory system 110 described with reference to FIGS. 1 to 6.

Thus, the memory controller 6120 may include a RAM, a processor, a host interface, a memory interface and an error correction component. The memory controller 130 may further include the elements described in FIGS. 1 and 6.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with a present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 5.

The memory controller 6120 and the memory device 6130 may be integrated into a single semiconductor device. For example, the memory controller 6120 and the memory device 6130 may form a solid state driver (SSD). Also, the memory controller 6120 and the memory device 6130 may form a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and/or a universal flash storage (UFS).

Figure 9:
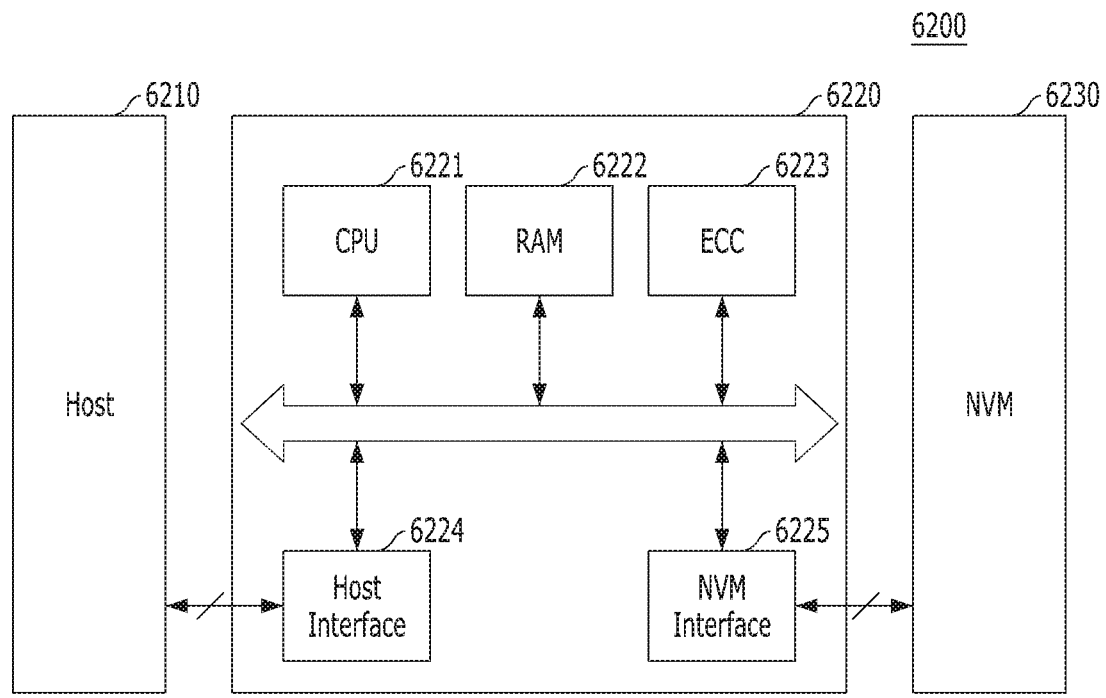

FIG. 9 is a diagram schematically illustrating another example of the data processing system including a memory system, in accordance with a present embodiment.

Referring to FIG. 9, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (CF, SD, micro-SD or the like) or USB device, as described with reference to FIG. 1. The memory device 6230 may correspond to the memory device 150 in the memory system 110 described in FIGS. 1 to 6, and the memory controller 6220 may correspond to the controller 130 in the memory system 110 described in FIGS. 1 to 6.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control the operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with a present embodiment may be applied to wired/wireless electronic devices, particularly a mobile electronic device.

Figure 10:
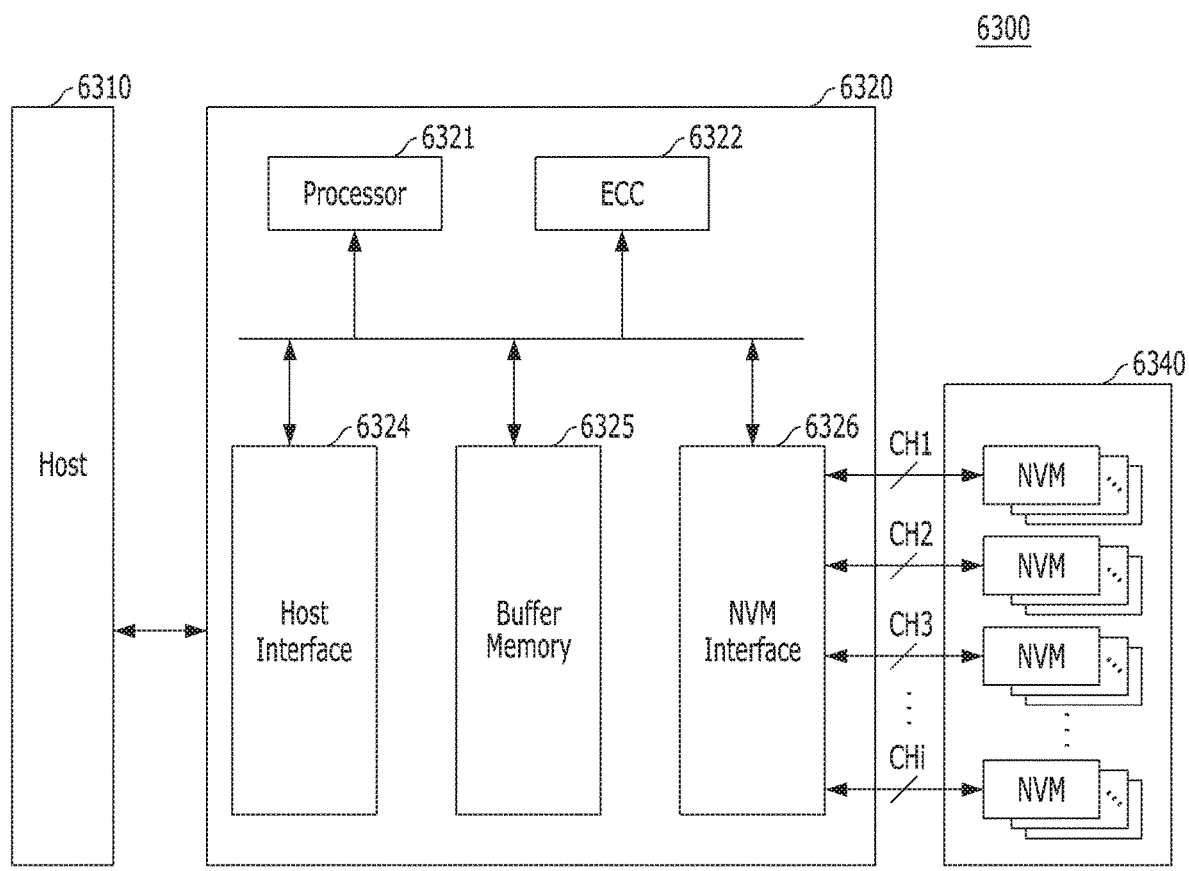

FIG. 10 is a diagram schematically illustrating another example of the data processing system including the memory system in accordance with a present embodiment. FIG. 10 schematically illustrates an SSD to which the memory system is applied.

Referring to FIG. 10, the SSD 6300 may include a controller 6320 and a memory device 6340 including a plurality of nonvolatile memories. The controller 6320 may correspond to the controller 130 in the memory system 110 of FIGS. 1 and 6, and the memory device 6340 may correspond to the memory device 150 in the memory system of FIGS. 1 and 6.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 9 illustrates that the buffer memory 6325 exists in the controller 6320. However, the buffer memory 6325 may external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 6 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 11:
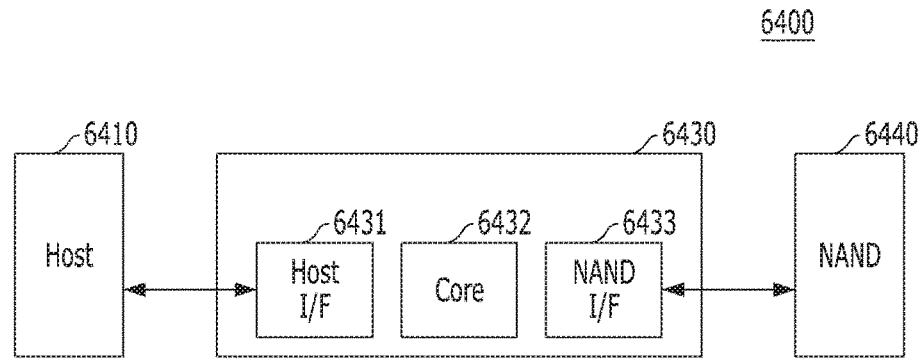

FIG. 11 is a diagram schematically illustrating another example of the data processing system including the memory system in accordance with an embodiment. FIG. 11 schematically illustrates an embedded Multi-Media Card (eMMC) to which the memory system is applied.

Referring to FIG. 11, the eMMC 6400 may include a controller 6430 and a memory device 6440 embodied by one or more NAND flash memories. The controller 6430 may correspond to the controller 130 in the memory system 110 of FIGS. 1 and 6, and the memory device 6440 may correspond to the memory device 150 in the memory system 110 of FIGS. 1 and 6.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control the operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 12 to 15 are diagrams schematically illustrating other examples of the data processing system including the memory system in accordance with embodiments. FIGS. 12 to 15 schematically illustrate UFS (Universal Flash Storage) systems to which the memory system is applied.

Referring to FIGS. 12 to 15, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices, particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices, particularly mobile electronic devices, through UFS protocols, and the UFS devices 6520, 6620, 6720 and 6820 and the UFS cards 6530, 6630, 6730 and 6830 may be embodied by the memory system 110 illustrated in FIGS. 1 and 6. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 9 to 11, and the UFS cards 6530, 6630, 6730 and 6830 may be embodied in the form of the memory card system 6100 described with reference to FIG. 8.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 12:
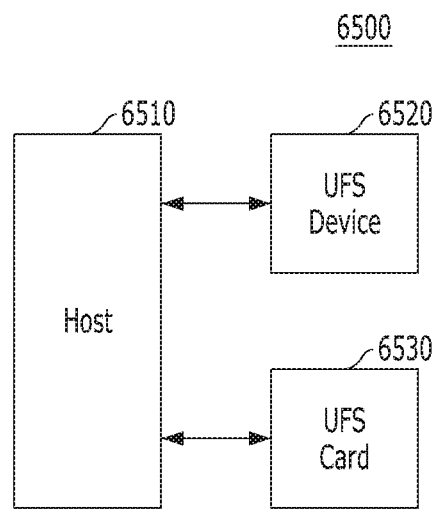

In the UFS system 6500 illustrated in FIG. 12, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In a present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 13:
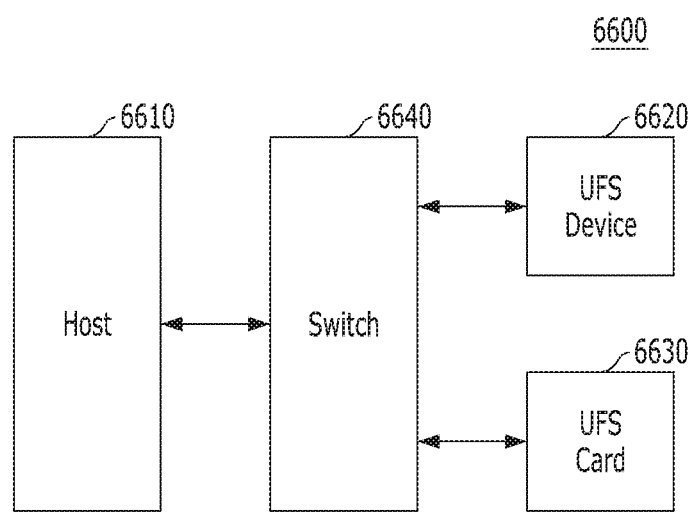

In the UFS system 6600 illustrated in FIG. 13, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In a present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 14:
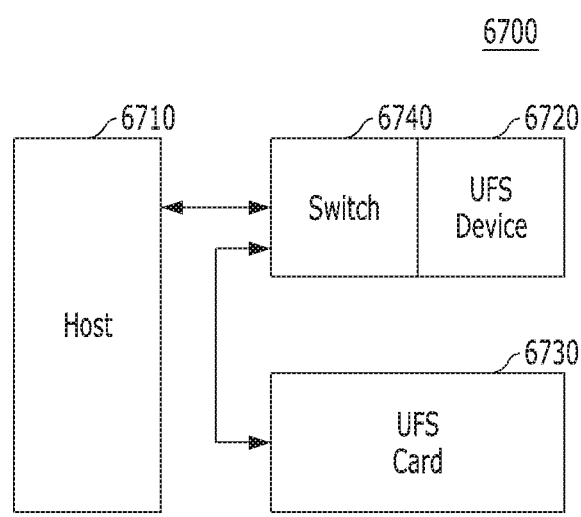

In the UFS system 6700 illustrated in FIG. 14, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In a present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 15:
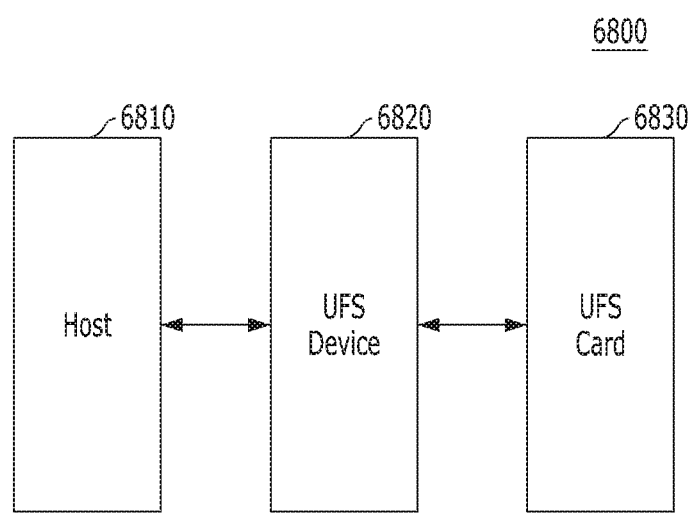

In the UFS system 6800 illustrated in FIG. 15, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In a present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 16:
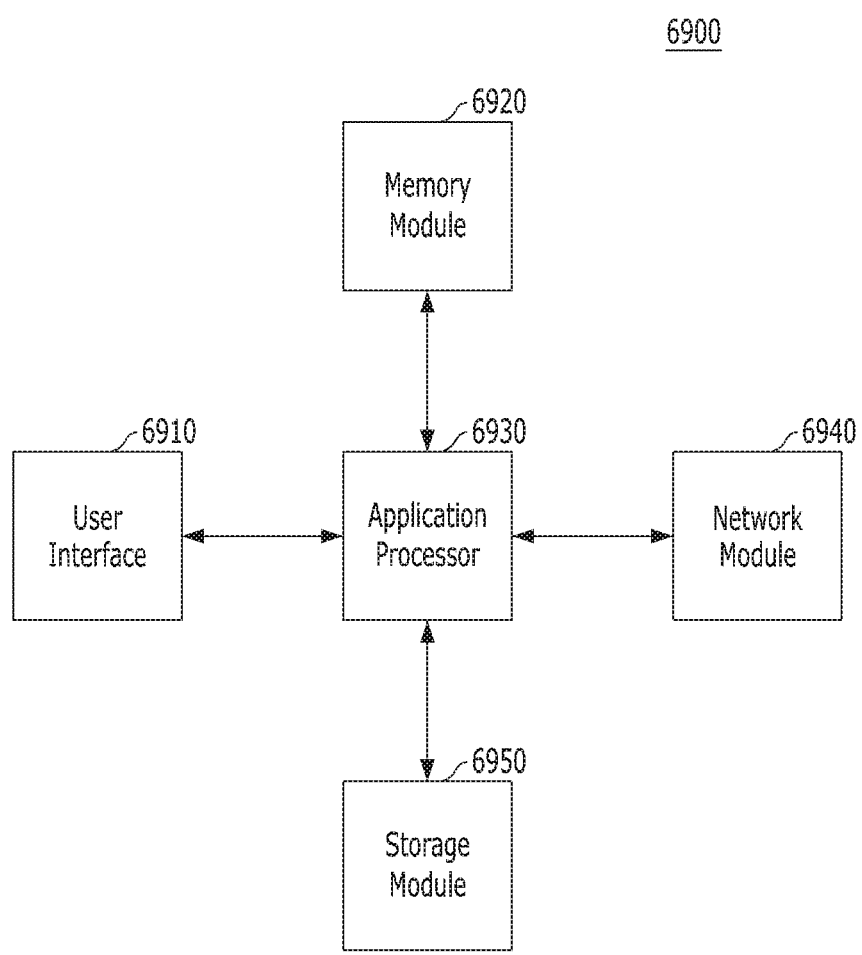

FIG. 16 is a diagram schematically illustrating another example of the data processing system including the memory system in accordance with an embodiment. FIG. 16 is a diagram schematically illustrating a user system to which the memory system is applied.

Referring to FIG. 16, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as a System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but may also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 6. Furthermore, the storage module 6950 may be embodied as an SSD, eMMC and UFS as described above with reference to FIGS. 10 to 15.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 6 is applied to a mobile electronic device of the user system 6900, the application processor 6930 may control the operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

While the present invention has been described with respect to specific embodiments, it will be apparent to those skilled in the art in light of the foregoing description that various changes and modifications may be made without departing from the spirit and scope of the invention as defined in the following claims.

What is claimed is:

1. A memory system, comprising:
    a memory device including a plurality of memory dies including a plurality of planes including a plurality of blocks; and
    a controller suitable for managing the plurality of blocks by grouping the plurality of blocks into a plurality of super blocks in accordance with a predetermined condition, managing normal blocks which are not grouped into the super blocks in a replacement block pool, setting each of the plurality of super blocks that includes at least one bad block to a bad super block, and then changing each bad super block in which the at least one bad block is replaced with a normal block of the replacement block pool using replacement information to a recovery super block, wherein the normal block is included in the same plane of the same memory die as the bad block or a different plane as the bad block, wherein the replacement information includes flags each indicating whether a normal block of the replacement block pool is included in the same plane of the same memory die as a corresponding bad block, wherein when a normal block of the replacement block pool is included in the same plane of the same memory die as a corresponding bad block, the controller sets a corresponding flag to have a first value, and when the normal block is included in a different plane as the corresponding block, the controller sets a corresponding flag to have a second value, and wherein when accessing a specific recovery super block in which at least one normal block of the replacement block pool replaces at least one bad block, the controller operates the specific recovery super block in an interleaving scheme when it is determined that all flags in the replacement information have the first value, and operates the specific recovery super block without the interleaving scheme when it is determined that at least one flag in the replacement information has the second value.

2. The memory system of claim 1, wherein the controller manages the blocks as the super blocks by grouping the blocks according to a first priority of the predetermined condition in which the interleaving operation is possible.

3. The memory system of claim 1,
wherein a physical table for indicating a physical address of each of the normal blocks of the replacement block pool is included in index form in the replacement information,
wherein the controller stores physical addresses of the bad blocks of each of the bad super blocks and the flags.

4. The memory system of claim 3, wherein the controller replaces the physical addresses of the bad blocks among physical addresses of blocks in each of the bad super blocks with the physical addresses of the normal blocks of the replacement block pool, which are used for replacing the bad blocks, referring to the physical table, and then manages the physical addresses corresponding to each of the recovery super blocks.

5. The memory system of claim 1, wherein the controller generates bad occurrence information for managing the super blocks in the flags by dividing the super blocks into normal super blocks and bad super blocks.

6. An operating method of a memory system that includes a memory device including a plurality of memory dies including a plurality of planes including a plurality of blocks, comprising:
managing the plurality of blocks by grouping the plurality of blocks into a plurality of super blocks in accordance with a predetermined condition;
managing normal blocks which are not grouped into the super blocks in a replacement block pool; and
setting each of the plurality of super blocks that includes at least one bad block to a bad super block, and then changing each bad super block in which at least one bad block is replaced with a normal block of the replacement block pool using replacement information to a recovery super block, wherein the normal block is included in the same plane of the same memory die as the bad block or a different plane as the bad block, wherein the replacement information includes flags each indicating whether a normal block of the replacement block pool is included in the same plane of the same memory die as a corresponding bad block, wherein when a normal block of the replacement block pool is included in the same plane of the same memory die as a corresponding bad block, the controller sets a corresponding flag to have a first value, and when the normal block is included in a different plane as the corresponding block, the controller sets a corresponding flag to have a second value, and wherein when accessing a specific recovery super block in which at least one normal block of the replacement block pool replaces at least one bad block, the operating method further includes:
checking values of the flags included in the replacement information;
operating the specific recovery super block in an interleaving scheme when it is determined that all flags in the replacement information have the first value; and
operating the specific recovery super block without the interleaving scheme when it is determined that at least one flag in the replacement information has the second value.

7. The operating method of claim 6, wherein the managing of the plurality of blocks is carried out by grouping the blocks according to a first priority of the predetermined condition in which the interleaving operation is possible.

8. The operating method of claim 6,
wherein a physical table for indicating a physical address of each of the normal blocks of the replacement block pool is included in index form in the replacement information,
wherein the setting and changing operations further include:
storing physical addresses of the bad blocks of each of the bad super blocks and the flags in the physical table corresponding to the normal blocks of the replacement block pool, which are used for replacing the bad blocks of the bad super blocks.

9. The operating method of claim 8, wherein the setting and changing operations further include:
replacing the physical addresses of the bad blocks among physical addresses of blocks in each of the bad super blocks with the physical addresses of the normal blocks of the replacement block pool, which are used for replacing the bad blocks, referring to the physical table, and then managing the physical addresses corresponding to each of the recovery super blocks.

10. The operating method of claim 6, wherein the setting and changing operations include:
generating bad occurrence information for managing the super blocks in the bitmap flags form by dividing the super blocks into normal super blocks and bad super blocks.

11. A memory system comprising:
a memory device including a plurality of super blocks each having a group of memory blocks, and a plurality of reserved blocks; and
a controller suitable for:

recovering a super block including a bad block by replacing the bad block with a reserved block included in the same plane of the same die as the bad block or a different plane as the bad block, adding a flag indicating whether the reserved block and the bad block is included in the same plane of the same memory die to a replacement information for the recovered super block, performing, for accessing the recovered super block, a Boolean operation of one or more flags included in the replacement information for the recovered super block, and accessing memory blocks in the recovered super block parallelly or sequentially depending on a result of the Boolean operation.

12. The memory system of claim 11, wherein, as the result of the Boolean operation, when all of the one or more flags have first values indicating a reserved block in the recovered super block is included in the same plane of the same memory die as corresponding bad block, the controller accesses the memory blocks parallelly by using interleaving scheme.

13. The memory system of claim 11, wherein, as the result of the Boolean operation, when at least one of the flags have a second value indicating a reserved block in the recovered super block included in a different plane as corresponding bad block, the controller accesses the memory blocks sequentially.

14. The memory system of claim 11, wherein when there is a reserved block included in the same plane of the same memory die as the bad block among the reserved blocks, the controller recovers the super block by replacing the bad block with the reserved block included in the same plane of the same die as the bad block, and wherein when there is no reserved block included in the same plane of the same memory die as the bad block among the reserved blocks, the controller recovers the super block by replacing the bad block with a reserved block included in different plane as the bad block.

* * * * *